US008735215B2

(12) United States Patent
Park et al.

(10) Patent No.: US 8,735,215 B2
(45) Date of Patent: May 27, 2014

(54) METHOD OF MANUFACTURING VARIABLE RESISTANCE MEMORY DEVICE

(75) Inventors: Jeong-Hee Park, Hwaseong-si (KR); Man-Sug Kang, Suwon-si (KR); Hideki Horii, Seoul (KR); Hyo-Jung Kim, Hwaseong-si (KR); Jung-Hwan Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 53 days.

(21) Appl. No.: 13/242,237

(22) Filed: Sep. 23, 2011

(65) Prior Publication Data
US 2012/0149165 A1 Jun. 14, 2012

(30) Foreign Application Priority Data
Dec. 14, 2010 (KR) .................. 10-2010-0127580

(51) Int. Cl.
*H01L 21/06* (2006.01)
*H01L 45/00* (2006.01)

(52) U.S. Cl.
CPC ............... *H01L 45/06* (2013.01); *H01L 45/14* (2013.01); *H01L 45/141* (2013.01)
USPC ................ 438/102; 257/2; 365/148

(58) Field of Classification Search
CPC ........................................... H01L 45/14
USPC ................. 438/102; 365/148; 257/2
See application file for complete search history.

(56) References Cited

U.S. PATENT DOCUMENTS

| | | | | |
|---|---|---|---|---|
| 4,968,637 A | * | 11/1990 | Mozzi et al. | 438/167 |
| 6,867,114 B2 | | 3/2005 | Moore et al. | |
| 2005/0136605 A1 | * | 6/2005 | Murto et al. | 438/303 |
| 2007/0109836 A1 | * | 5/2007 | Lung | 365/148 |
| 2008/0075843 A1 | | 3/2008 | Kuh et al. | |
| 2009/0233421 A1 | * | 9/2009 | Lee et al. | 438/478 |
| 2010/0129995 A1 | * | 5/2010 | Im et al. | 438/483 |
| 2011/0121254 A1 | * | 5/2011 | Dressler et al. | 257/4 |
| 2011/0193045 A1 | * | 8/2011 | Schrott et al. | 257/2 |

FOREIGN PATENT DOCUMENTS

| | | | | |
|---|---|---|---|---|
| JP | 01233778 A | * | 9/1989 | H01L 31/08 |
| KR | 100873878 | | 12/2008 | |
| KR | 20090088007 A | | 8/2009 | |
| WO | WO 2010012683 A1 | * | 2/2010 | H01L 45/00 |

* cited by examiner

*Primary Examiner* — Allen Parker
(74) *Attorney, Agent, or Firm* — Harness, Dickey & Pierce, P.L.C.

(57) ABSTRACT

An example embodiment relates to a method including forming a bottom electrode and an insulating layer on a substrate, the insulating layer defining a first opening that exposes a portion of the bottom electrode. The method includes forming a variable resistance material pattern, including a plurality of elements, to fill the first opening. The variable resistance material pattern may be doped with a dopant that includes at least one of the plurality of elements in the variable resistance material pattern. The method includes forming a top electrode on the variable resistance material pattern.

19 Claims, 27 Drawing Sheets

METHOD OF MANUFACTURING VARIABLE RESISTANCE MEMORY DEVICE

CROSS-REFERENCE TO RELATED APPLICATION

This application claims priority under 35 U.S.C. §119 to the benefit of Korean Patent Application No. 10-2010-0127580 filed on Dec. 14, 2010, the disclosure of which is hereby incorporated by reference in its entirety.

BACKGROUND

1. Field

Some example embodiments of the inventive concepts relate to a method of manufacturing a variable resistance memory device.

2. Description of Related Art

Semiconductor memory devices include volatile memory devices such as dynamic random access memory (DRAM) and static random access memory (SRAM), and non-volatile memory devices. The non-volatile memory devices may include an electrically erasable and programming ROM (EEPROM), a variable resistance memory device, and a flash memory device.

SUMMARY

Some example embodiments of the inventive concepts provide a method of manufacturing a variable resistance memory device.

In accordance with an example embodiment of the inventive concepts, a method of manufacturing a variable resistance memory device includes preparing a substrate, forming a bottom electrode on the substrate, forming an insulating layer including a first opening on the substrate, forming a variable resistance material pattern to fill the first opening, doping the variable resistance material pattern with a dopant, and forming a top electrode on the variable resistance material pattern. The first opening exposes a portion of the bottom electrode, and the dopant includes at least one element among a plurality of elements composing the variable resistance material pattern.

The dopant may include at least one element having a heat of vaporization that is greater than a different element among the plurality of elements composing the variable resistance material pattern.

Doping the variable resistance material pattern with the dopant may include injecting the dopant into the variable resistance material pattern.

Injecting the dopant into the variable resistance material pattern may include injecting the dopant into an interface between the variable resistance material pattern and the bottom electrode.

The method may further include heat-treating the substrate before forming the top electrode.

The method may further include forming a mask pattern including a second opening aligned with the first opening on the insulating layer before injecting the dopant.

The method may further include forming a capping layer on the insulating layer before injecting the dopant.

Forming the variable resistance material pattern may include forming a variable resistance material layer to fill the first opening, and planarizing the variable resistance material layer.

Forming the variable resistance material layer may include depositing the variable resistance material layer using a plasma process.

The dopant may include at least one of germanium, indium, copper, carbon, titanium, cobalt, tungsten, silicon, boron, tin and gallium.

The variable resistance material pattern may include a crystalline region and an amorphous region.

The crystalline region may extend from a central lower portion of the first opening, and the amorphous region may be on an upper portion of a sidewall of the first opening.

Doping the variable resistance material pattern with the dopant may include forming a diffusion source layer on the variable resistance material pattern, and heat-treating the substrate to diffuse the dopant from the diffusion source layer to the variable resistance material pattern.

In accordance with an example embodiment of the inventive concepts, a method of manufacturing a variable resistance memory device includes forming an insulating layer on a substrate, the insulating layer defining an opening that exposes a portion of a bottom electrode on the substrate, forming a first variable resistance material layer to fill the opening on the substrate. The first variable resistance material layer may include a plurality of elements, the plurality of elements including at least one element having a heat of vaporization that is greater than an other element among the plurality of elements. The method may further include forming a second variable resistance material layer by doping the first variable resistance material layer with a dopant, the dopant including the at least one element having a heat of vaporization that is greater than the other element among the plurality of elements, forming a variable resistance material pattern by planarizing the second variable resistance material layer until a top surface of the insulating layer is exposed, and forming a top electrode on the variable resistance material pattern.

The method may further include forming a capping layer on the first variable resistance material layer before forming the second variable resistance material layer.

The method may further include forming a first insulating layer on the substrate, the first insulating layer defining a contact hole, forming a spacer on sidewalls of the contact hole, and forming the bottom electrode in the contact hole between the spacer. The forming the first variable resistance material layer of the method may include removing a seam of the first variable resistance material layer.

In accordance with an example embodiment of the inventive concepts, a method of manufacturing a memory device includes treating a variable resistance material pattern on a bottom electrode to form a treated variable resistance material pattern, and forming a top electrode on the treated variable resistance material pattern. The treating may increase a concentration of an element in a first region of the variable resistance material pattern, the first region having a lower concentration of the element than a second region of the variable resistance material pattern prior to the heating.

The variable resistance may include at least one of tellurium (Te), selenium (Se), and antimony (Sb). The variable resistance pattern may also include at least one of germanium (Ge), bismuth (Bi), lead (Pb), tin (Sn), silver (Ag), arsenic (As), sulfur (S), silicon (Si), phosphorous (P), oxygen (O), indium (In), and nitrogen (N).

The treating the variable resistance material pattern may include doping the element into a portion of the variable material resistance pattern.

The method may further include manufacturing an electronic system including the foregoing method of manufacturing a memory device and further including connecting the bottom electrode and the top electrode to a controller.

BRIEF DESCRIPTION OF THE DRAWINGS

The foregoing and other features and advantages of inventive concepts will be apparent from the more particular description of non-limiting embodiments of inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
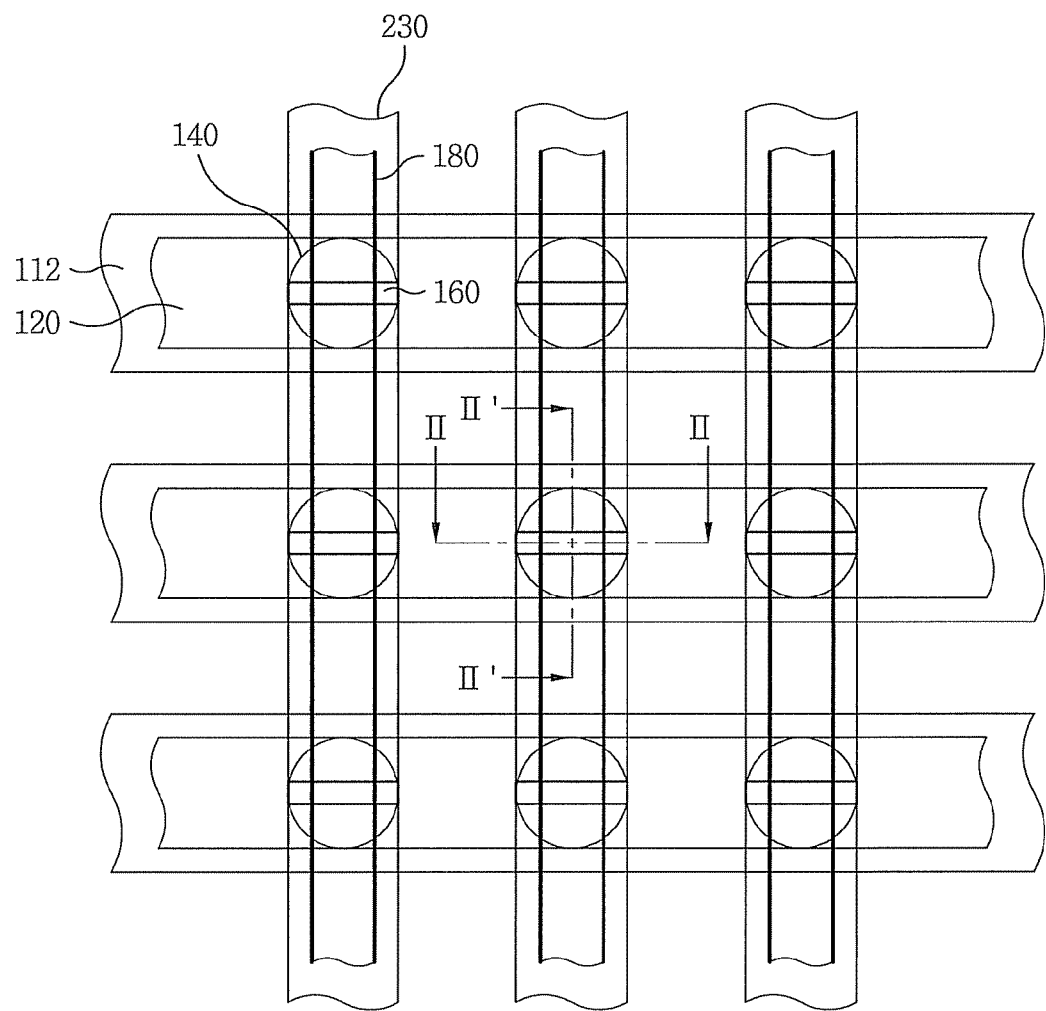
FIG. 1 is a lay-out of a variable resistance memory device according to a first example embodiment of the inventive concepts.

Various example embodiments will now be described more fully with reference to the accompanying drawings in which some example embodiments are shown. These example embodiments of inventive concepts may, however, be embodied in different forms and should not be construed as limited to the embodiments set forth herein. Rather, these example embodiments are provided so that this disclosure will be thorough and complete, and will fully convey the inventive concepts of example embodiments to those skilled in the art. In the drawings, the sizes and relative sizes of layers and regions may be exaggerated for clarity. Like reference numerals in the drawings denote like elements, and thus description will be omitted.

It will be understood that when an element or layer is referred to as being "on," "connected to" or "coupled with" another element or layer, it can be directly on, connected or coupled to the other element or layer or intervening elements or layers may be present. In contrast, when an element is referred to as being "directly on," "directly connected to" or "directly coupled with" another element or layer, there are no intervening elements or layers present. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments of inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Some example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIRST EXAMPLE EMBODIMENT

Figure 2:
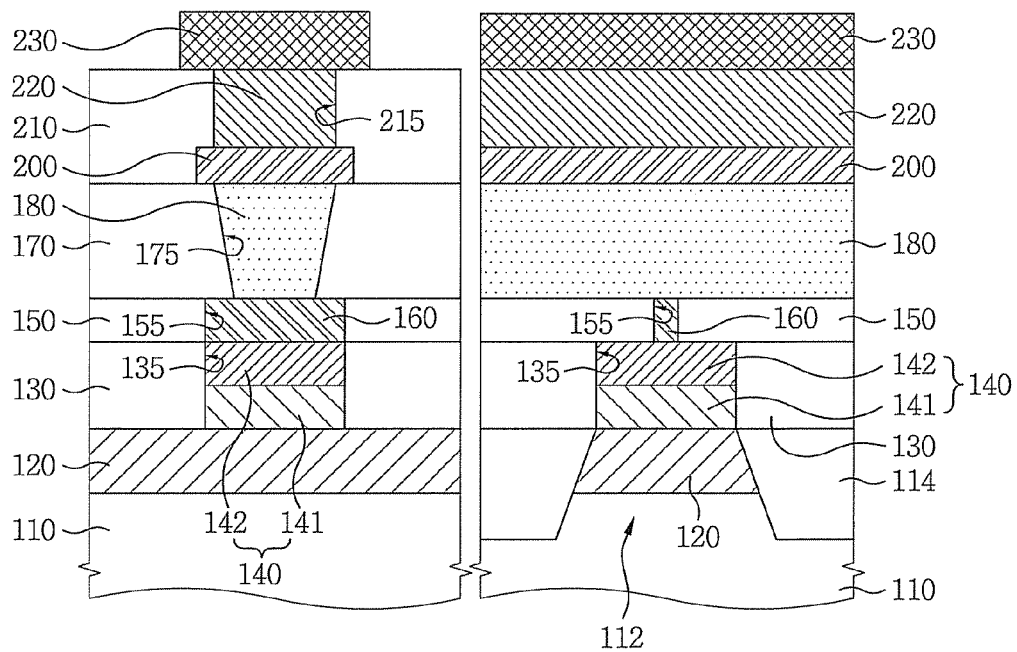
FIG. 2 is a cross-sectional view taken along lines II-II and II'-II' of FIG. 1.

FIG. 1 is a lay-out of a variable resistance memory device according to a first example embodiment of the inventive concepts. FIG. 2 is a cross-sectional view taken along lines II-II and of FIG. 1.

Referring to FIGS. 1 and 2, a variable resistance memory device according to a first example embodiment of the inventive concepts may include a plurality of word lines 120 arranged in parallel in one direction, a plurality of bit lines 230 arranged to cross with the plurality of word lines 120, a plurality of diodes 140, a plurality of bottom electrodes 160 and a plurality of first variable resistance material patterns 180.

The plurality of word lines 120 may be formed in an active region 112 of a substrate 110. A shallow trench isolation 114 may be formed in the substrate 110 to confine the active region 112. The plurality of diodes 140 and the plurality of bottom electrodes 160 may be formed between the plurality of word lines 120 and the plurality of bit lines 230. The plurality of diodes 140 may be confined by a first insulating layer 130 including a first contact hole 135. The diode 140 may include one or more diode patterns, for example a first diode pattern 141 and a second diode pattern 142. A second insulating layer 150 including a second contact hole 155 may be formed on the first insulating layer 130. The bottom electrodes 160 may be in the second contact hole 155. The variable memory device may include a third insulating layer 170 on the second insulating layer 150, and a fourth insulating layer 210 on the third insulating layer 170. The third insulating layer 170 may include a first opening 175 filled by the first variable resistance material patterns 180. The fourth insulating layer 210 may include at least one second opening 215 exposing a portion of at least one top electrode 200. At least one contact plug 220 may fill at least one of the second openings 215 to provide at least one connection between the bit lines 230 and the top electrodes 200.

The plurality of bottom electrodes 160 may be electrically connected with the plurality of word lines 120. The plurality of bottom electrodes 160 may have a bar shape which is extended in the same direction as the plurality of word lines 120, but other shapes for the plurality of bottom electrodes 160 may used according to some example embodiments.

Figure 3A:
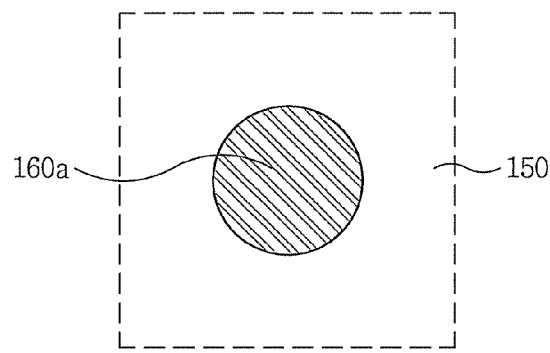
FIGS. 3A through 3G show various bottom electrodes of a variable resistance memory device according to some example embodiments of the inventive concepts.
Figure 3B:
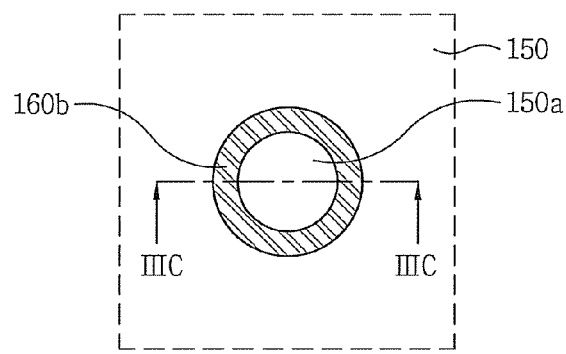
Figure 3C:
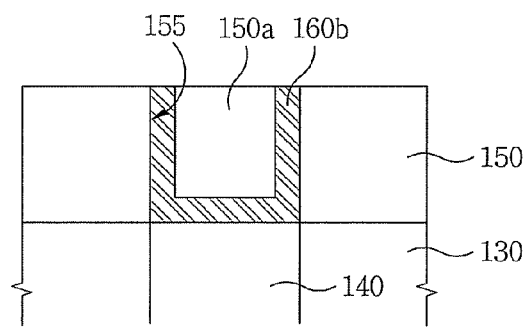
Figure 3D:
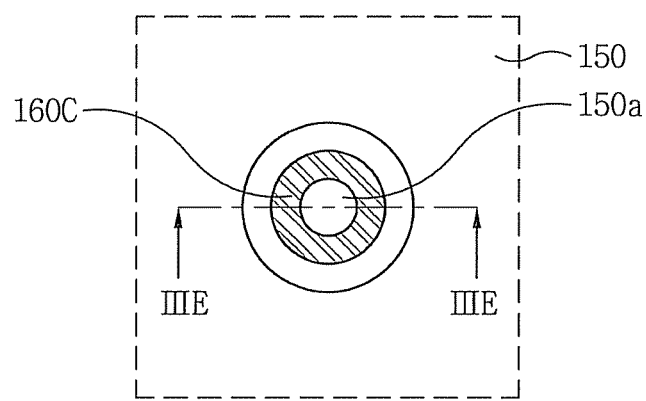
Figure 3E:
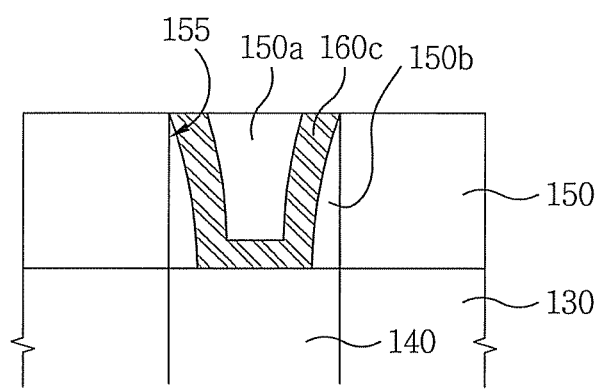

FIGS. 3A, 3B and 3D are top views of various shapes of the plurality of bottom electrode 160a, 160b, and 160c. FIG. 3C is a cross-sectional view taken along line IIIC-IIIC of FIG. 3B. FIG. 3E is a cross-sectional view taken along line IIIE-IIIE of FIG. 3D.

Referring to FIG. 3A, the bottom electrode 160a of the variable resistance memory device according to an example embodiment of the inventive concepts may have a pillar shape including a circular plane so that the bottom electrode 160a may be confined by a second insulating layer 150 including a second contact hole 155 which is circular in shape.

Referring to FIGS. 3B and 3C, the bottom electrode 160b of the variable resistance memory device according to an example embodiment of the inventive concepts may have a ring shape and/or cylinder shape which includes a vertical sidewall so that the variable resistance memory device may further include a core insulating layer 150a filling the inside of the bottom electrode 160b.

Referring to FIGS. 3D and 3E, the bottom electrode 160c of the variable resistance memory device according to an example embodiment of the inventive concepts may have a ring shape or cylinder shape which includes an inclined sidewall so that a contact area between the bottom electrode 160c and the first variable resistance material pattern 180 of FIG. 2 which is formed on the bottom electrode 160c can be reduced in the variable resistance memory device according to an example embodiment of the inventive concepts. To this end, the method of manufacturing the variable resistance memory device according to an example embodiment of the inventive concepts may include forming a first spacer insulating layer 150b in the second contact hole 155.

Figure 3F:
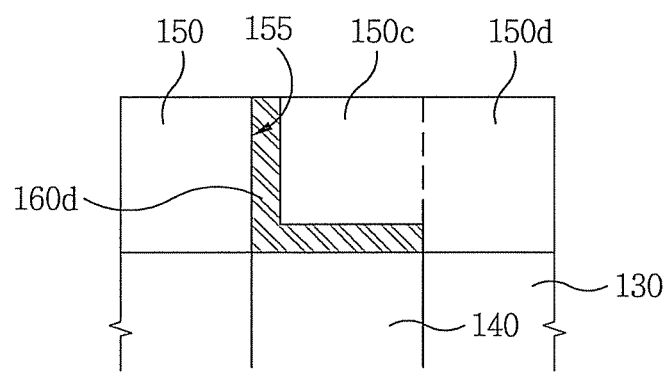
Figure 3G:
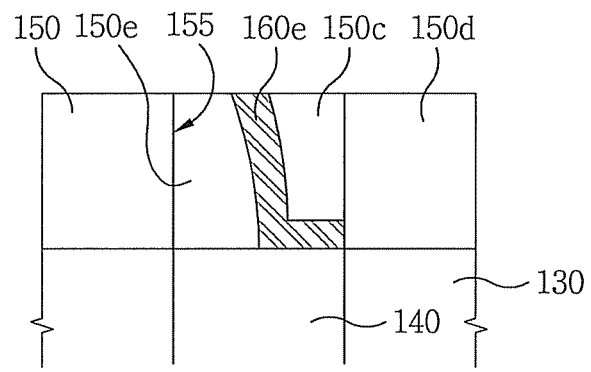

FIGS. 3F and 3G are other cross-sectional views of the bottom electrode of the variable resistance memory device according to some example embodiments of the inventive concepts.

Referring to FIGS. 3F and 3G, the bottom electrode 160 of the variable resistance memory device according to example embodiments of the inventive concepts may have a dash shape extending along the word lines 120. The bottom electrode 160d of the variable resistance memory device according to some example embodiments of the inventive concepts may include a longitudinal section of an "L" shape 160d so that a contact area between the bottom electrode 160d and the first variable resistance material pattern 180 of FIG. 2 may be reduced and a contact area between the bottom electrode 160d and the diode 140 may be increased in the variable resistance memory device according to some example embodiments of the inventive concepts. The bottom electrodes 160d contact insulating layers 150, 150c, and 150d.

Two adjacent bottom electrodes 160d may be formed at the same time. The two adjacent bottom electrodes 160d may be symmetrical in shape. Alternatively, two adjacent bottom electrodes may be asymmetrical in shape. The second contact hole 155 may be formed to expose a top surface of the two adjacent bottom electrodes 160d. Next, a bottom electrode layer (not shown) may be formed on the second insulating layer 150. Then, the bottom electrode layer may be planarized until a top surface of the second insulating layer 150 is exposed. After that, the two adjacent bottom electrodes 160d which are separated from each other may be formed by patterning the bottom electrode layer. Next, a separate insulating layer 150d may fill a gap between the two adjacent bottom electrodes 160d. The separate insulating layer 150d may be a different material from the second insulating layer 150 so that the bottom electrode 160d may be in contact with three different insulating layers 150, 150c and 150d.

As illustrated FIG. 3G, the variable resistance memory device according to an example embodiment of the inventive concepts may include a second spacer insulating layer 150e which is formed in the second contact hole 155.

The bottom electrode 160e of the variable resistance memory device according to some example embodiments of the inventive concepts may have an arc shape or semi-circular shape 160e.

The plurality of first resistance material patterns 180 may be formed in a region that the plurality of word lines 120 and the plurality of bit lines 230 overlap. The plurality of first variable resistance material patterns 180 may be formed between the plurality of word lines 120 and the plurality of bit lines 230. The plurality of first variable resistance material patterns 180 may fill trenches which are extended in the same direction as the plurality of bit lines 230.

In the variable resistance memory device according to the first example embodiment of the inventive concepts, it is explained that trenches are filled with the plurality of first variable resistance material patterns 180. However, the plurality of first variable resistance material patterns 180 may be a pillar in shape.

FIGS. 4 through 22 are cross-sectional views sequentially illustrating a method of manufacturing a variable resistance memory device according to the first example embodiment of the inventive concepts. FIG. 23 is a flowchart illustrating the method according to the first example embodiment of the inventive concepts.

Figure 4:
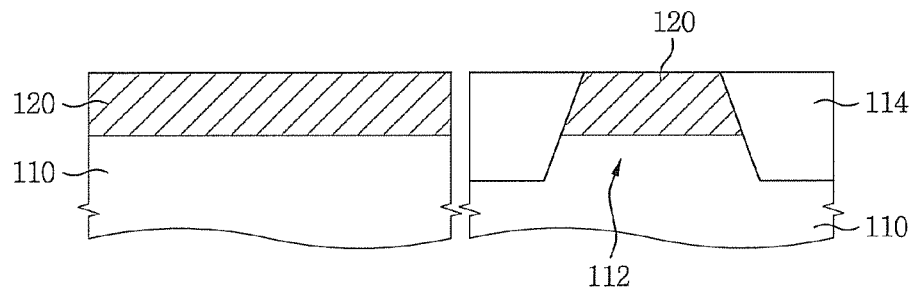
FIGS. 4 through 22 are cross-sectional views sequentially illustrating a method of manufacturing a variable resistance memory device according to a first example embodiment of the inventive concepts.

A method of manufacturing the variable resistance memory device according to the first example embodiment of the inventive concepts will be described below with reference to FIGS. 2 and 4 through 23. First, as illustrated in FIG. 4 and described in FIG. 23, the method of manufacturing the variable resistance memory device according to the first example embodiment of the inventive concepts may include preparing a substrate 110 including an active region 112 (S101).

The substrate 110 may be a semiconductor substrate such as a silicon wafer or a silicon on insulator (SOI) wafer, but example embodiments are not limited thereto. A shallow trench isolation (STI) 114 may be formed in the substrate 110 to confine the active region 112. The shallow trench isolation 114 may be formed of a dielectric material including one of a silicon oxide (SiO) layer, a silicon nitride (SiN) layer and a combination thereof.

The substrate 110 may be doped with first conductive impurities. The active region 112 may be doped with second conductive impurities different from the first conductive impurities so that the word line 120 may be formed in the active region 112.

Figure 5:
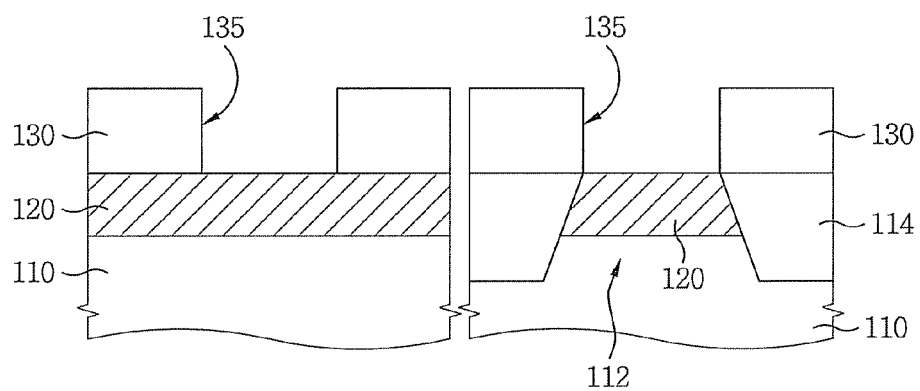

Next, as illustrated in FIG. 5, the method of manufacturing the variable resistance memory device according to the first example embodiment of the inventive concepts may include forming a first insulating layer 130 including a first contact hole 135 which exposes a portion of the word line 120, on the substrate 110. The first insulating layer 130 may be an insulating material formed of one of a silicon oxide (SiO) layer, a silicon nitride (SiN) layer, a silicon oxynitride (SiON) layer and a combination thereof, but example embodiments are not limited thereto. The first insulating layer 130 may be a single layer or a plurality of layers.

Figure 6:
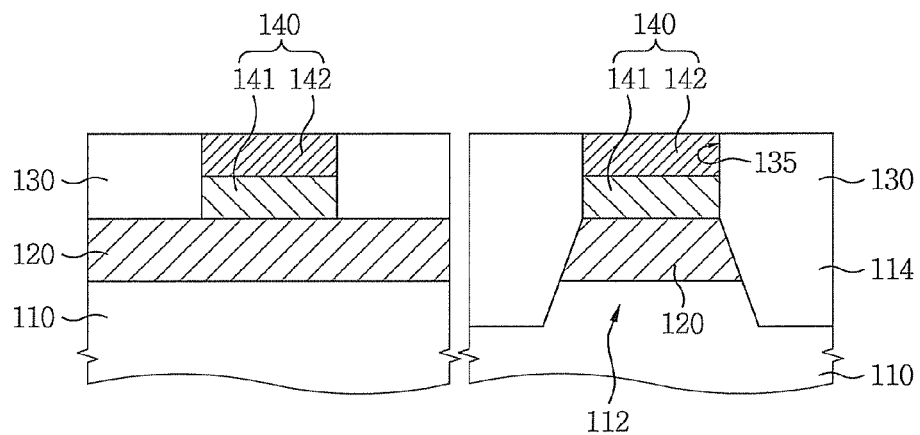

Then, as illustrated in FIG. 6 and described in FIG. 23, the method of manufacturing the variable resistance memory device according to the first example embodiment of the inventive concepts may include forming a diode 140 in the first contact hole 135 (S102). The diode 140 may be electrically connected with the active region 112 and the word line 120. The diode 140 may serve as a selection device.

In the variable resistance memory device according to the first example embodiment of the inventive concepts, it is explained that the diode 140 is formed as a selection device. However, the selection device may be a transistor (not shown).

The diode 140 may include a first diode pattern 141 and a second diode pattern 142. The first diode pattern 141 and the second diode pattern 142 may be formed by chemical vapor deposition (CVD) or epitaxial growth, but example embodiments are not limited thereto.

The first diode pattern 141 and the second diode pattern 142 may be formed of semiconductor materials, such as silicon layers of different conductivities. For example, the first diode pattern 141 may be an N-type silicon layer, and the second diode pattern 142 may a P-type silicon layer, but example embodiments are not limited thereto.

Figure 7:
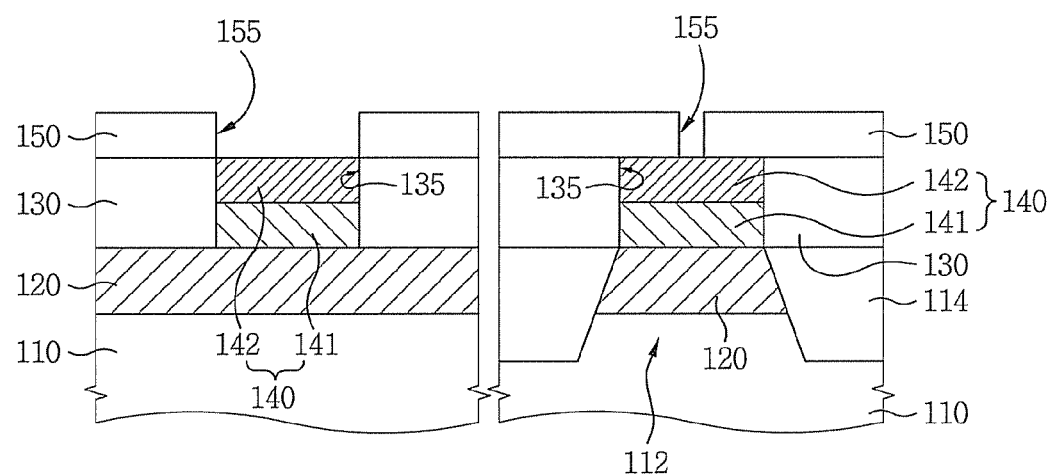

Next, as illustrated in FIG. 7, the method of manufacturing the variable resistance memory device according to the first example embodiment of the inventive concepts may include forming a second insulating layer 150 including a second contact hole 155 which exposes a portion of the diode 140, on the substrate 110.

The second insulating layer 150 may be formed of an insulating material, such as one of silicon oxide (SiO) layer, a silicon nitride (SiN) layer, silicon oxynitride (SiON) layer, and a combination thereof, but example embodiments are not limited thereto. The second insulating layer 150 may be formed of the same material as the first insulating layer 130 so that the first insulating layer 130 and the second insulating layer 150 may be unified.

Figure 8:
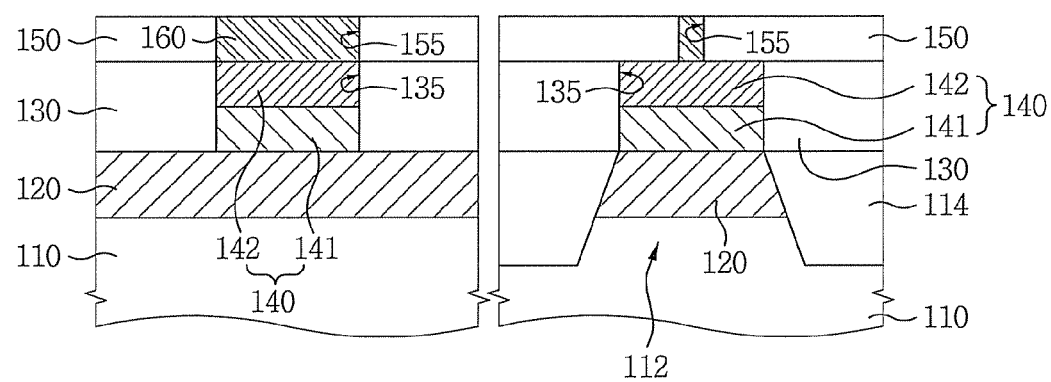

Next, as illustrated in FIG. 8 and described in FIG. 23, the method of manufacturing the variable resistance memory device according to the first example embodiment of the inventive concepts may include forming a bottom electrode 160 electrically connected with the active region 112, in the second contact hole 155 (S103).

The process of forming the bottom electrode 160 may include forming a bottom electrode layer (not shown) in the second contact hole 155 on the second insulating layer 150, and planarizing the bottom electrode layer to expose a top surface of the second insulating layer 150.

The bottom electrode layer may include at least one of a titanium (Ti) layer, a titanium nitride (TiN) layer, a titanium aluminum nitride (TiAlN) layer, a titanium silicon nitride (TiSiN) layer, a titanium carbon nitride (TiCN) layer, a tantalum (Ta) layer, a tantalum nitride (TaN) layer, a tantalum aluminum nitride (TaAlN) layer, a tantalum silicon nitride (TaSiN) layer, a tantalum carbon nitride (TaCN) layer, a cobalt (Co) layer, a cobalt silicon nitride (CoSiN) layer, a tungsten (W) layer, a tungsten nitride (WN) layer, a tungsten silicon nitride (WSiN) layer, a nickel (Ni) layer, a nickel silicon (NiSi) layer, a carbon (C) layer, a carbon nitride (CN) layer and a combination thereof, but example embodiments are not limited thereto.

Figure 9:
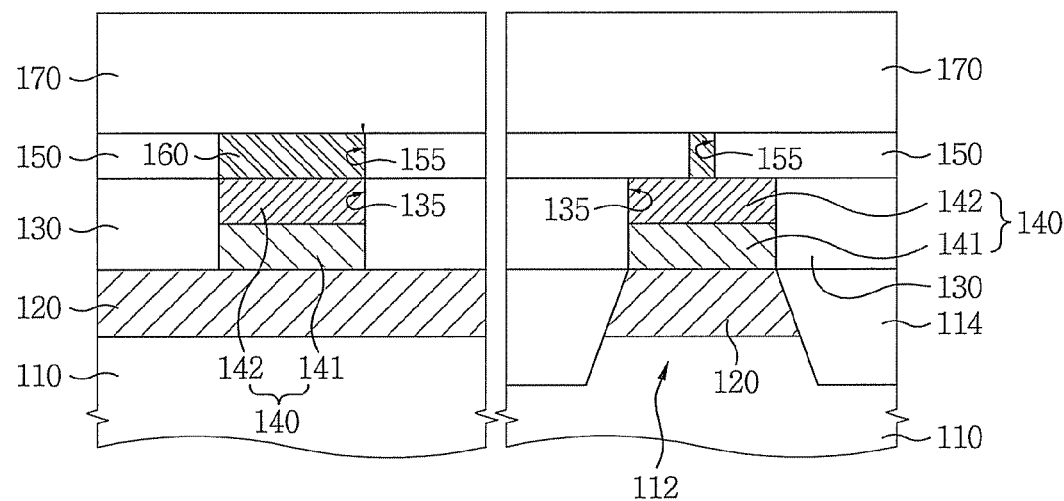

Then, as illustrated in FIG. 9, the method of manufacturing the variable resistance memory device according to the first example embodiment of the inventive concepts may include forming a third insulating layer 170 covering the bottom electrode 160 on the second insulating layer 150. The third insulating layer 170 may be formed of an insulating material, such as one of a silicon oxide (SiO) layer, a silicon nitride (SiN) layer, a silicon oxynitride (SiON) layer and a combination thereof.

Figure 10:
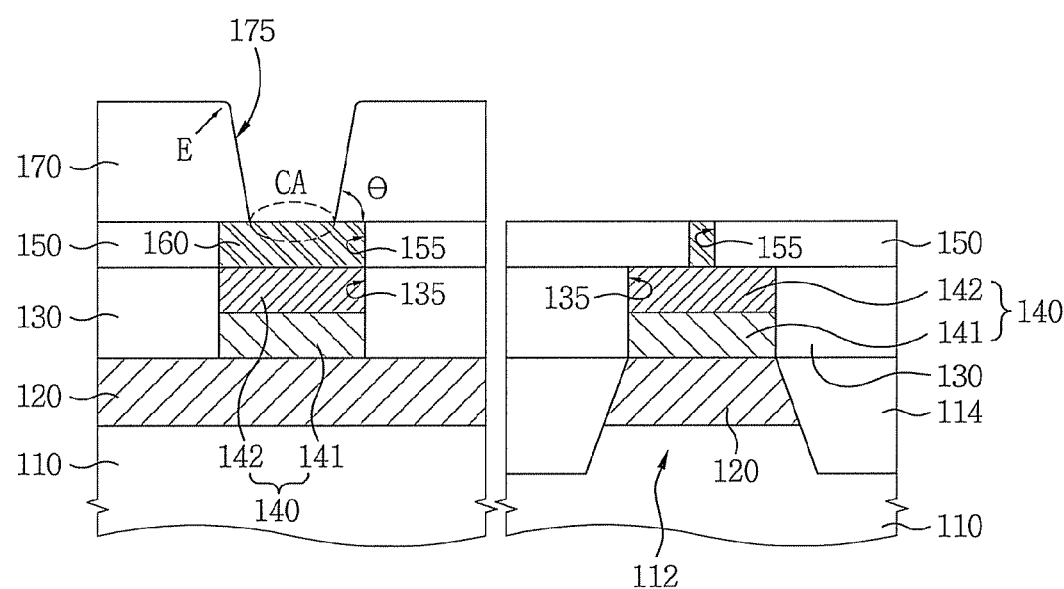

After that, as illustrated in FIG. 10 and described in FIG. 23, the method of manufacturing the variable resistance memory device according to the first example embodiment of the inventive concepts may include forming a first opening 175 exposing a partial area CA of the bottom electrode 160 in the third insulating layer 170 (S104).

The first opening 175 may be formed to have an area increased toward a top surface of the third insulating layer 170 from a top surface of the bottom electrode 160. Thus, a sidewall of the first opening 175 may have a desired (or alternatively predetermined) angle θ with respect to the top surface of the bottom electrode 160. A top surface edge E of the first opening 175 may be rounded with a desired (or alternatively predetermined) curvature.

In the variable resistance memory device according to the first example embodiment of the inventive concepts, the first opening 175 may have a trench shape including an inclined sidewall. However, example embodiments are not limited thereto. The first opening 175 may have a hole shape including an inclined sidewall. Also, the first opening 175 may have a trench shape or a hole shape including a vertical sidewall.

Figure 11:
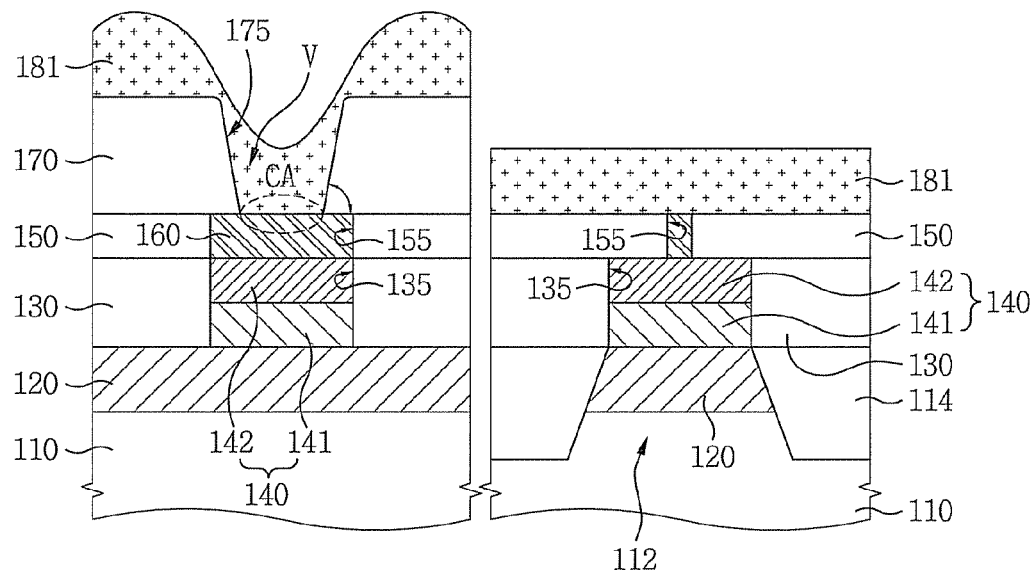

Next, as illustrated in FIG. 11 and described in FIG. 23, the method of manufacturing the variable resistance memory device according to the first example embodiment of the inventive concepts may include forming a preliminary variable resistance material layer 181 on the third insulating layer 170 (S105). The preliminary variable resistance material layer 181 may be formed by one of CVD, physical vapor deposition (PVD) and atomic layer deposition (ALD). The preliminary variable resistance material layer 181 may be formed at a temperature of about 250° C. to 350° C. in order to reduce (and/or prevent) evaporation.

The preliminary variable resistance material layer 181 may be formed of a variable resistance material capable of changing states according to specific resistance. The preliminary variable resistance material layer 181 may be formed of a compound including at least one of tellurium (Te) and selenium (Se) which are chalcogenide elements and antimony (Sb) which is a pnictogen element, and at least one element of germanium (Ge), bismuth (Bi), lead (Pb), tin (Sn), silver (Ag), arsenic (As), sulfur (S), silicon (Si), phosphorus (P), oxygen (O), indium (In), and nitrogen (N). For example, the preliminary variable resistance material layer 181 may be formed of at least one of Ge—Sb—Te, As—Sb—Te, As—Ge—Sb—Te, Sn—Sb—Te, Ag—In—Sb—Te, In—Sb—Te, group 5A element-Sb—Te, group 6A element-Sb—Te, group 5A element-Sb—Se, group 6A element-Sb—Se, Ge—Sb, In—Sb, Ga—Sb, etc. The preliminary variable resistance material layer 181 may further include at least one of bismuth (Bi), nitrogen (N), carbon (C), boron (B), phosphorus (P), oxygen (O) and arsenic (As).

Figure 12:
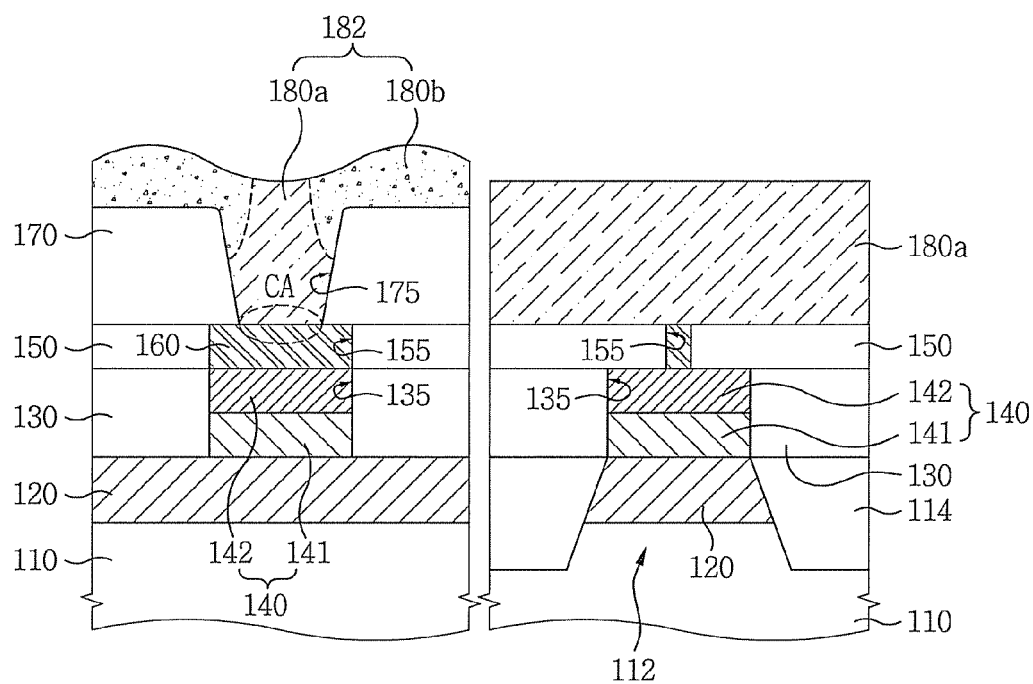

Then, as illustrated in FIG. 12 and described in FIG. 23, the method of manufacturing the variable resistance memory device according to the first example embodiment of the inventive concepts may include forming a first variable resistance material layer 182 to fill the first opening 175 (S106).

Forming the first variable resistance material layer 182 may include removing a void or seam V, as shown in FIG. 11, of the preliminary variable resistance material layer 181 using a process of reflow or vaporization and condensation.

Removing a void or seam V of the preliminary variable resistance material layer 181 using vaporization and condensation may include forming plasma on the preliminary variable resistance material layer 181, and vaporizing or subli-mating a plurality of elements in the preliminary variable resistance material layer 181 by heating the preliminary variable resistance material layer 181. The void or seam V of the preliminary variable resistance material layer 181 may be filled with the plurality of elements vaporized or sublimated in the preliminary variable resistance material layer 181 by vaporization and condensation.

While FIGS. 11 and 12 illustrate separate process steps for forming the preliminary variable resistance material layer 181 and for forming the first variable resistance material layer 182, example embodiments are not limited thereto. In some example embodiments, the process of forming the preliminary variable resistance material layer 181 and the process of forming the first variable resistance material layer 182 using vaporization and condensation may be performed at the same time.

The method of manufacturing the variable resistance memory device according to the first example embodiment of the inventive concepts may include depositing the preliminary variable resistance material layer 181 using a plasma process. For example, the preliminary variable resistance material layer 181 may be formed by plasma enhanced chemical vapor deposition (PE-CVD) or PVD using the plasma.

Also, a layer formed by deposition using plasma energy may have about 1.3 times higher atomic density or more than a layer formed by deposition using thermal energy. Therefore, the preliminary variable resistance material layer 181 formed by a deposition process using plasma may have a relatively higher density of atomic or material layer.

Herein, if the void or seam V of the preliminary variable resistance material layer 181 is removed by vaporization and condensation or a process of reflow, one or more first elements (not shown) which have a relatively low heat of vaporization among the plurality of elements (not shown) composing the preliminary variable resistance material layer 181, may be moved more smoothly than second elements (not shown) which have a relatively high heat of vaporization among the plurality of elements.

A plurality of elements generally included in a variable resistance material layer have a heat of vaporization as shown in Table 1 below.

TABLE 1

| Element | Heat of Vaporization (KJ/mol) |
|---------|-------------------------------|
| Ge | 330 |
| Sb | 77 |
| Te | 53 |
| Se | 38 |
| Ti | 421 |
| Si | 384 |
| N | 2.79 |
| O | 3.41 |
| Ga | 254 |
| Bi | 105 |
| In | 232 |
| Cu | 300 |
| C | 356 |
| Co | 377 |
| W | 824 |
| B | 480 |
| Sn | 296 |
| Zr | 58 |

Referring to Table 1, the plurality of elements included in a variable resistance material layer may have a large difference in heat of vaporization. In particular, most chalcogens among of the plurality of elements may have a heat of vaporization of less than 200 KJ/mol. Therefore, the preliminary variable resistance material layer 181 may include at least one element having a heat of vaporization of 200 KJ/mol or more, and at least one element having a heat of vaporization of less than 200 KJ/mol.

The heat of vaporization of germanium (Ge) is 330 KJ/mol. The heat of vaporization of antimony (Sb) is 77 KJ/mol, and the heat of vaporization of tellurium (Te) is 53 KJ/mol. If a preliminary variable resistance material layer 181 is formed of Ge—Sb—Te, the amount of vaporized or sublimated germanium (Ge) may be relatively few compared with the amount of antimony and/or tellurium that is vaporized or sublimated. For example, in case of heating the preliminary variable resistance material layer 181 with an energy of 100 KJ/mol to 300 KJ/mol, germanium may not be vaporized or sublimated, but and antimony and tellurium may be vaporized or sublimated.

Therefore, the first variable resistance material layer 182 may include a first region 180a having a relatively low ratio of the second element, which has a relatively high heat of vaporization among the plurality of elements composing the preliminary variable resistance material layer 181, and a second region 180b which has a relatively high ratio of the second element. For example, the first variable resistance material layer 182 may include the first region 180a which has a relatively low ratio of germanium (Ge), and the second region 180b which has a relatively high ratio of germanium (Ge).

Herein, the first element may move to fill the void or seam V of the preliminary variable resistance material layer 181. Thus, the first region 180a may be formed in the first opening 175. More particularly, the preliminary variable resistance material layer 181 formed on the third insulating layer 170 has a higher surface energy level than the void or seam V disposed in the first opening 175. Therefore, vaporized or sublimated atoms may be moved to a surface of the void or seam V and condense.

The first region 180a may be a crystalline region, and the second region 180b may be an amorphous region. The crystalline region may mean that a combination of the constitutive elements is relatively stable. For example, if the first variable resistance material layer 182 includes germanium (Ge), antimony (Sb) and tellurium (Te), the crystalline region may have relatively many combinations of $Ge_2Sb_2Te_5$. On the other hand, the amorphous region may have relatively few combinations of $Ge_2Sb_2Te_5$.

In the method of manufacturing the variable resistance memory device according to the first example embodiment of the inventive concepts, the first region 180a may be formed in a central portion of the first opening 175, and the second region 180b may be formed adjacent to a sidewall of the first opening 175. In particular, the second region 180b may be formed more adjacent to an upper portion of the sidewall of the first opening 175.

Figure 13:
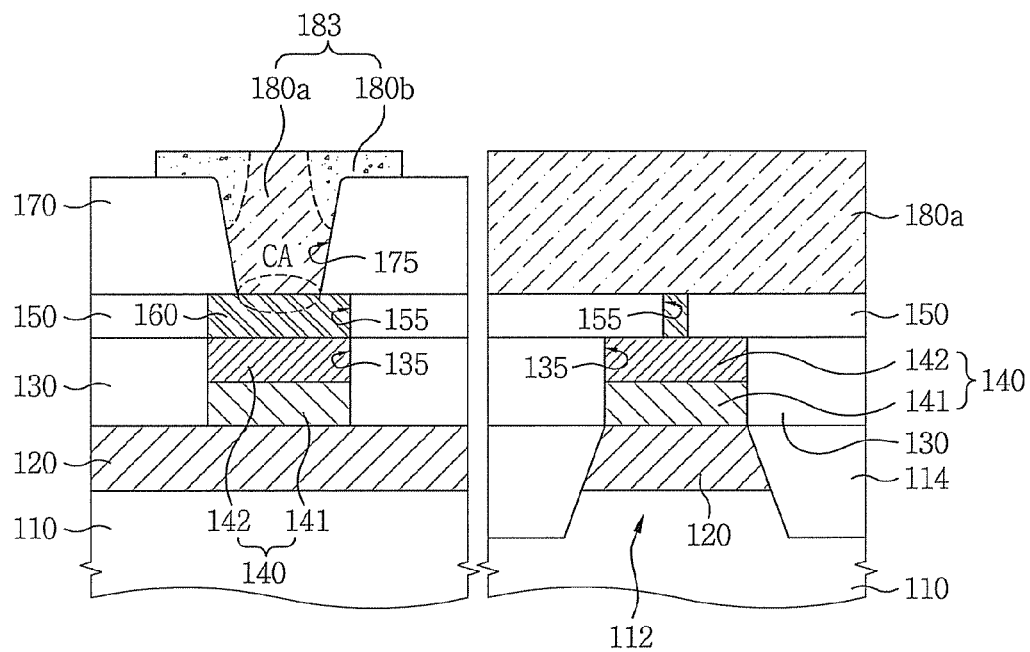

After that, as illustrated in FIG. 13 and described in FIG. 23, the method of manufacturing the variable resistance memory device according to the first example embodiment of the inventive concepts may include forming a second variable resistance material pattern 183 by patterning the first variable resistance material layer 182 (S107) so that the second variable resistance material patterns 183 may be formed to be spaced apart from each other at two adjacent first openings 175 along the plurality of word lines 120 shown in FIG. 1.

Figure 14:
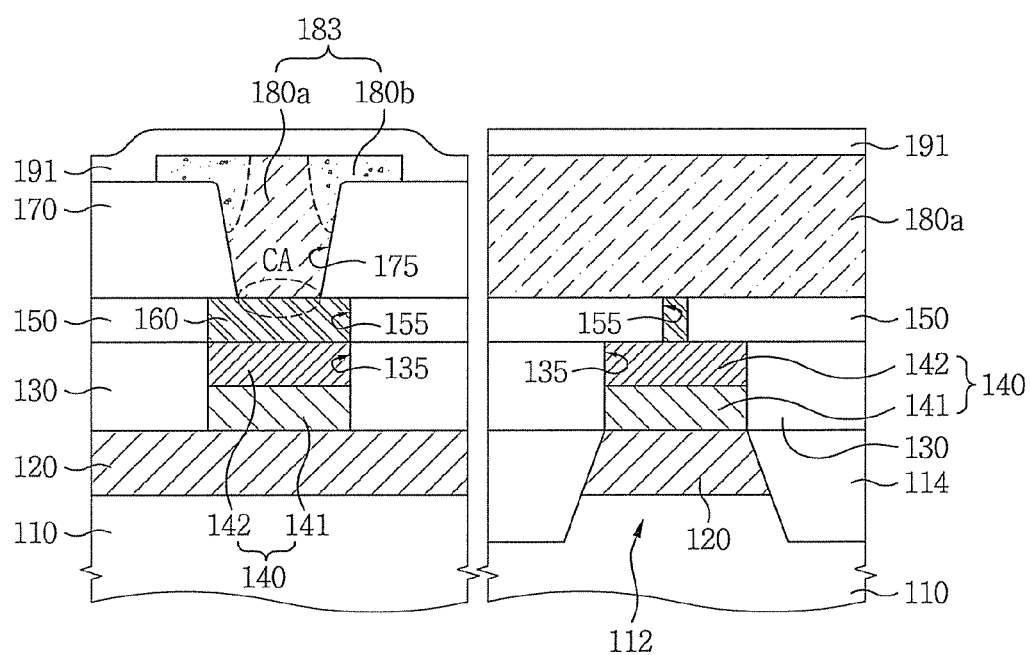

Next, as illustrated in FIG. 14, the method of manufacturing the variable resistance memory device according to the first example embodiment of the inventive concepts may include forming a capping layer 191 on the second variable resistance material pattern 183 (S108).

The capping layer 191 may reduce (and/or prevent) vaporization of the second variable resistance material pattern 183 during follow-up process. The capping layer 191 may be formed of an insulating material including at least one of a silicon oxide (SiO) layer, a silicon nitride (SiN) layer, a silicon oxynitride (SiON) layer, and a combination thereof.

Figure 15:
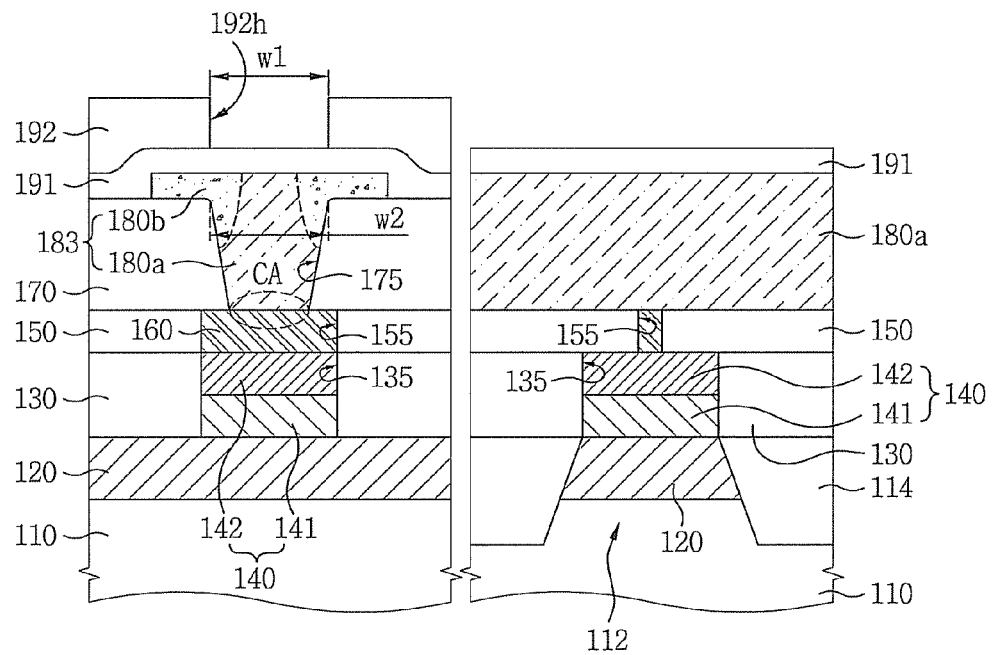

Then, as illustrated in FIG. 15, the method of manufacturing the variable resistance memory device according to the first example embodiment of the inventive concepts may include forming a mask pattern 192 including an opening 192h having a first width w1 on the capping layer 191 (S109). The first width w1 may be the same as a second width w2 which is a width of a top surface of the second variable resistance material pattern 183. The mask pattern 192 may be a photoresist pattern.

Figure 16:
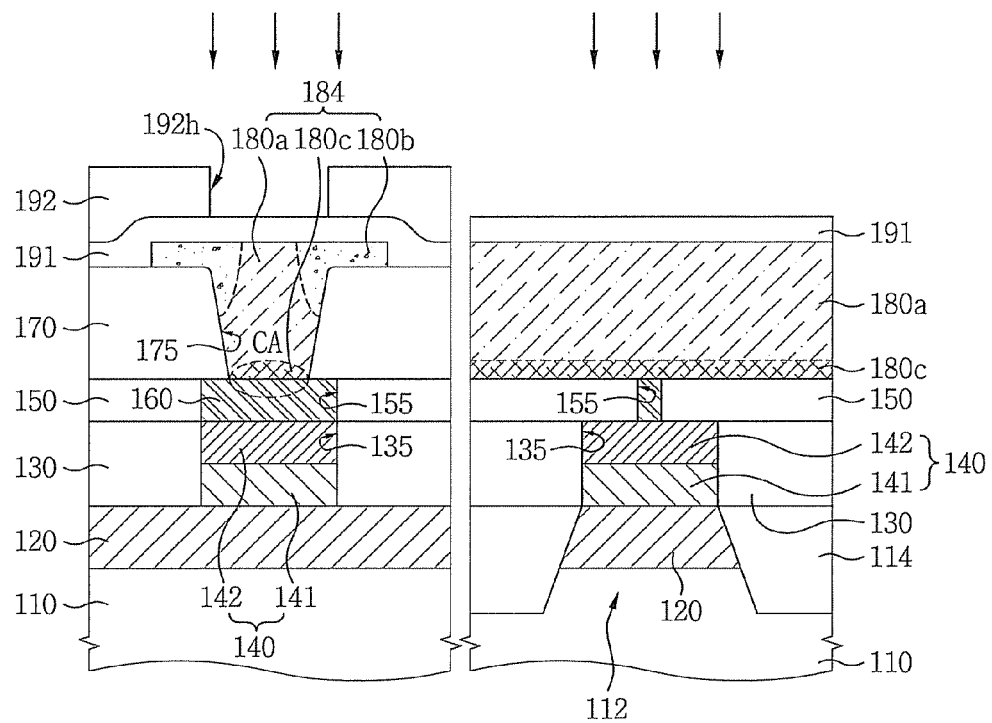

After that, as illustrated in FIG. 16 and described in FIG. 23, the method of manufacturing the variable resistance memory device according to the first example embodiment of the inventive concepts may include forming a third variable resistance material pattern 184 by injecting a dopant into the second variable resistance material pattern 183 (S110). The dopant may include at least one of the second elements which have a relatively high heat of vaporization among the plurality of elements composing the preliminary variable resistance material layer 181. For example, if the preliminary variable resistance material layer 181 is formed of Ge—Sb—Te, the dopant may include germanium (Ge).

Referring to Table 1 above, in the method of manufacturing the variable resistance memory device according to the first example embodiment of the inventive concepts, the dopant may include at least one of germanium (Ge), indium (In), copper (Cu), carbon (C), titanium (Ti), cobalt (Co), tungsten (W), silicon (Si), boron (B), tin (Sn) and gallium (Ga).

Also, the dopant may increase technical characteristics of the first variable resistance material pattern 180. Thus, the dopant may further include at least one of bismuth (Bi), nitrogen (N), phosphorus (P), oxygen (O), zirconium (Zr) and arsenic (As).

The process of doping with the dopant may increase stability and reliability of functional characteristics of the first variable resistance material pattern 180. Therefore, the third variable resistance material pattern 184 may be uniformly (or substantially uniformly) doped with the dopant.

Thus, forming the third variable resistance material pattern 184 may include injecting the dopant into a partial area CA of the bottom electrode 160 exposed through the first opening 175, that is, an interface between the bottom electrode 160 and the second variable resistance material pattern 183.

For this reason, the third variable resistance material pattern 184 may include a third region 180c on an interface between the third resistance material pattern 184 and the bottom electrode 160. The third region 180c may have a high density of the dopant compared with the first region 180a. The third region 180c may be formed in a lower portion of the first region 180a. After this, the mask pattern 192 may be removed.

Figure 17:
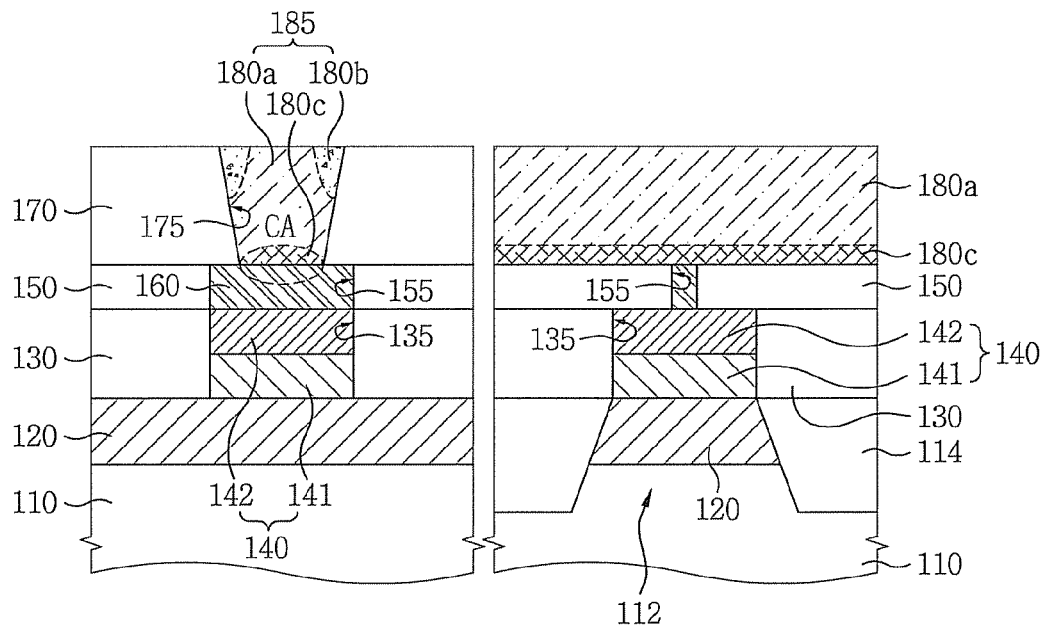

Next, as illustrated in FIG. 17 and described in FIG. 23, the method of manufacturing the variable resistance memory device according to the first example embodiment of the inventive concepts may include forming a fourth variable resistance material pattern 185 by planarizing the third variable resistance material pattern 184 and the capping layer 191 until a top surface of the third insulating layer 170 is exposed (S111).

Forming the fourth variable resistance material pattern 185 may include chemical mechanical polishing (CMP), but example embodiments are not limited thereto.

Figure 18:
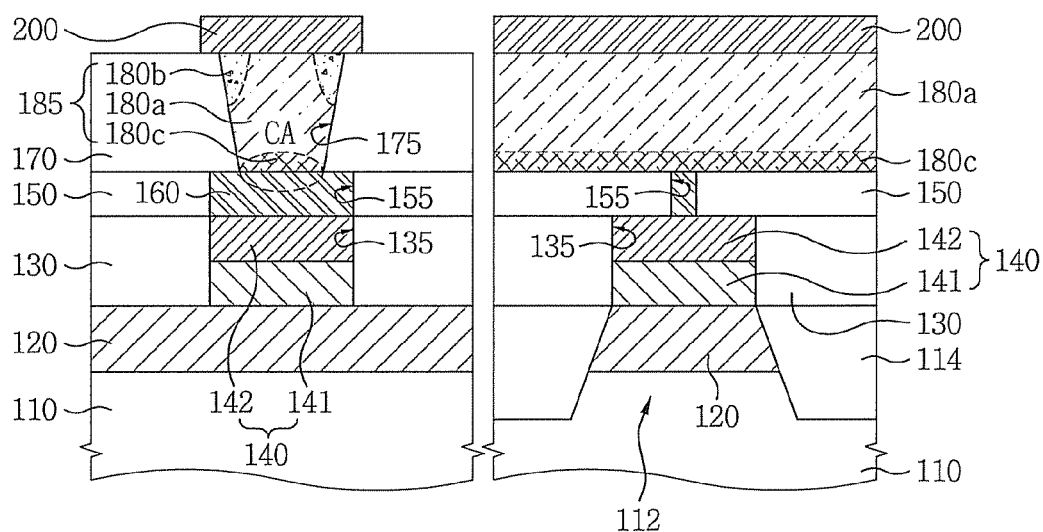

Then, as illustrated in FIG. 18 and described in FIG. 23, the method of manufacturing the variable resistance memory device according to the first example embodiment of the inventive concepts may include forming a top electrode 200 on the fourth variable resistance material pattern 185 (S112).

The top electrode 200 may be formed by forming a conductive material layer (not shown) on the third insulating layer 170 and patterning the conductive material layer. The top electrode 200 may be formed of at least one of a titanium (Ti) layer, a titanium nitride (TiN) layer, a titanium aluminum nitride (TiAlN) layer, a titanium silicon nitride (TiSiN) layer, a titanium carbon nitride (TiCN) layer, a tantalum (Ta) layer, a tantalum nitride (TaN) layer, a tantalum aluminum nitride (TaAlN) layer, a tantalum silicon nitride (TaSiN) layer, a tantalum carbon nitride (TaCN) layer, a cobalt (Co) layer, a cobalt silicon nitride (CoSiN) layer, a tungsten (W) layer, a tungsten nitride (WN) layer, a tungsten silicon nitride (WSiN) layer, a nickel (Ni) layer, a nickel silicon (NiSi) layer, a carbon (C) layer, a carbon nitride (CN) layer or a combination thereof.

Figure 19:
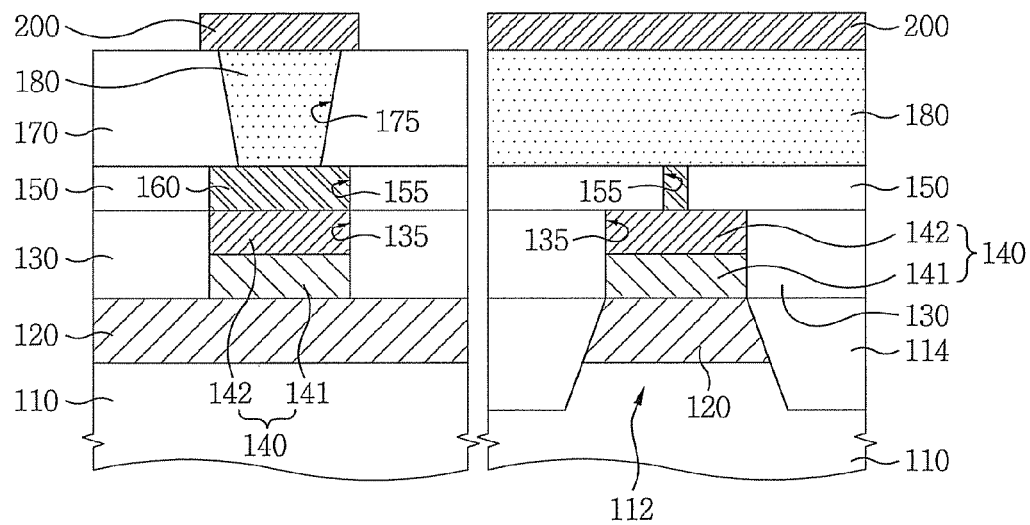

After that, as illustrated in FIG. 19 and described in FIG. 23, the method of manufacturing the variable resistance memory device according to the first example embodiment of the inventive concepts may include heat-treating the substrate 110 at a first processing temperature (S113) so that the dopant and a plurality of elements composing the fourth variable resistance material pattern 185 may be activated. Therefore, the fourth variable resistance material pattern 185 may become the first variable resistance material pattern 180 having a uniform (or substantially uniform) composition ratio on the whole. Thus, the first variable resistance material pattern 180 may be formed during the heat treatment of the substrate 110.

Herein, the preliminary variable resistance material layer 181 may be deposited at a second processing temperature for reducing and/or preventing vaporization of the plurality of elements composing the preliminary variable resistance material layer 181. On the other hand, during the heat treatment of the substrate 110, the top electrode 200 formed on the fourth variable resistance material pattern 185 may reduce and/or prevent vaporization of a plurality of elements composing the fourth variable resistance material pattern 185.

Therefore, the first processing temperature may be higher than the second processing temperature for forming the preliminary variable resistance material layer 181. For example, the second processing temperature may be 200° C. to 300° C., and the first processing temperature may be 400° C. to 600° C.

Figure 20:
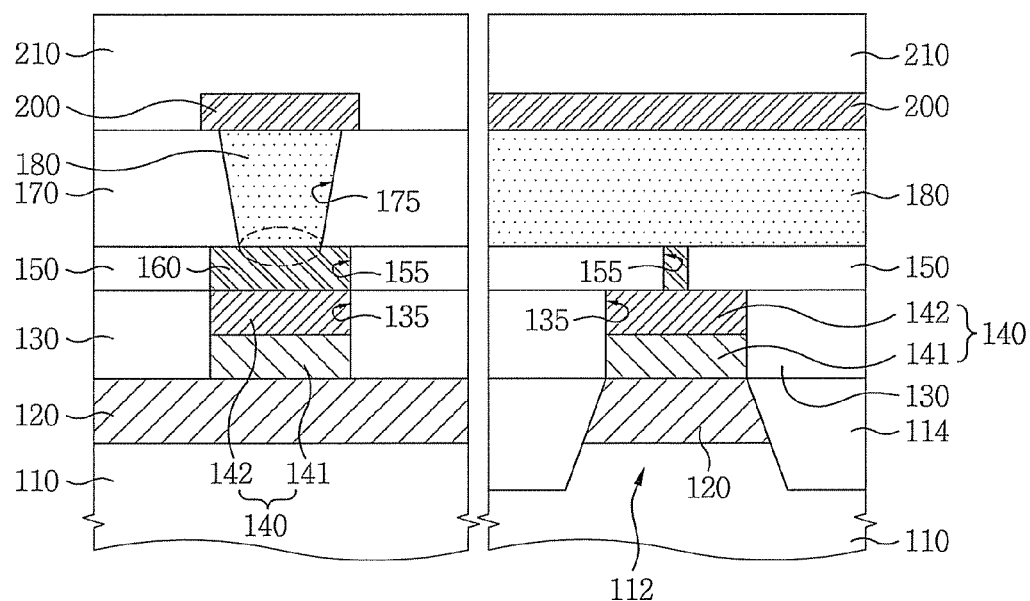

Next, as illustrated in FIG. 20, the method of manufacturing the variable resistance memory device according to the first example embodiment of the inventive concepts may include forming a fourth insulating layer 210 covering the top electrode 200 on the third insulating layer 170. The fourth insulating layer 210 may include a insulating material, for example a film formed of one of a silicon oxide (SiO) layer, a silicon nitride (SiN) layer, a silicon oxynitride (SiON) layer and a combination thereof.

Figure 21:
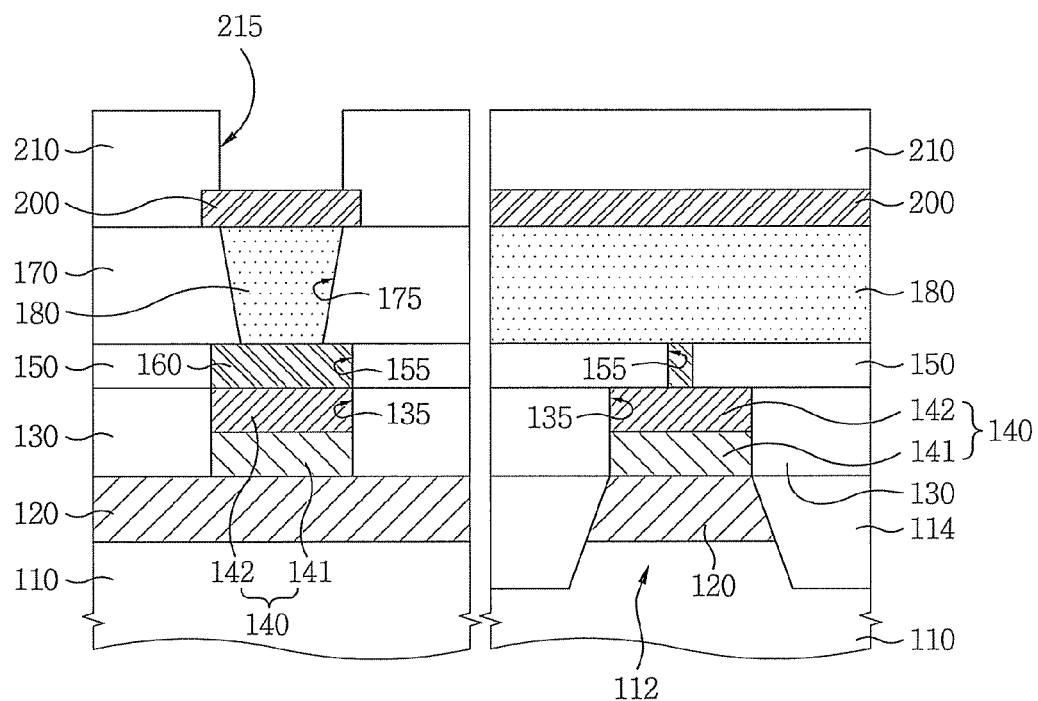

Then, as illustrated in FIG. 21, the method of manufacturing the variable resistance memory device according to the first example embodiment of the inventive concepts may include forming a second opening 215 exposing a portion of the top electrode 200 in the fourth insulating layer 210. The second opening 215 may have a trench shape or a contact hole shape. In an example embodiment, as illustrated in FIG. 21, the second opening 215 has a trench shape, but example embodiments are not limited thereto.

Figure 22:
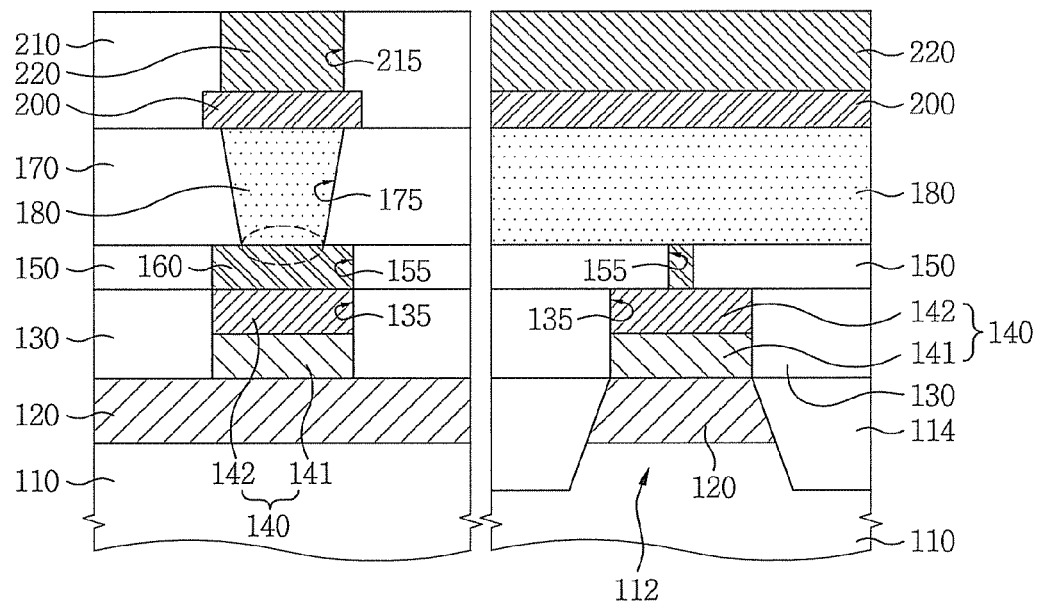
Figure 23:
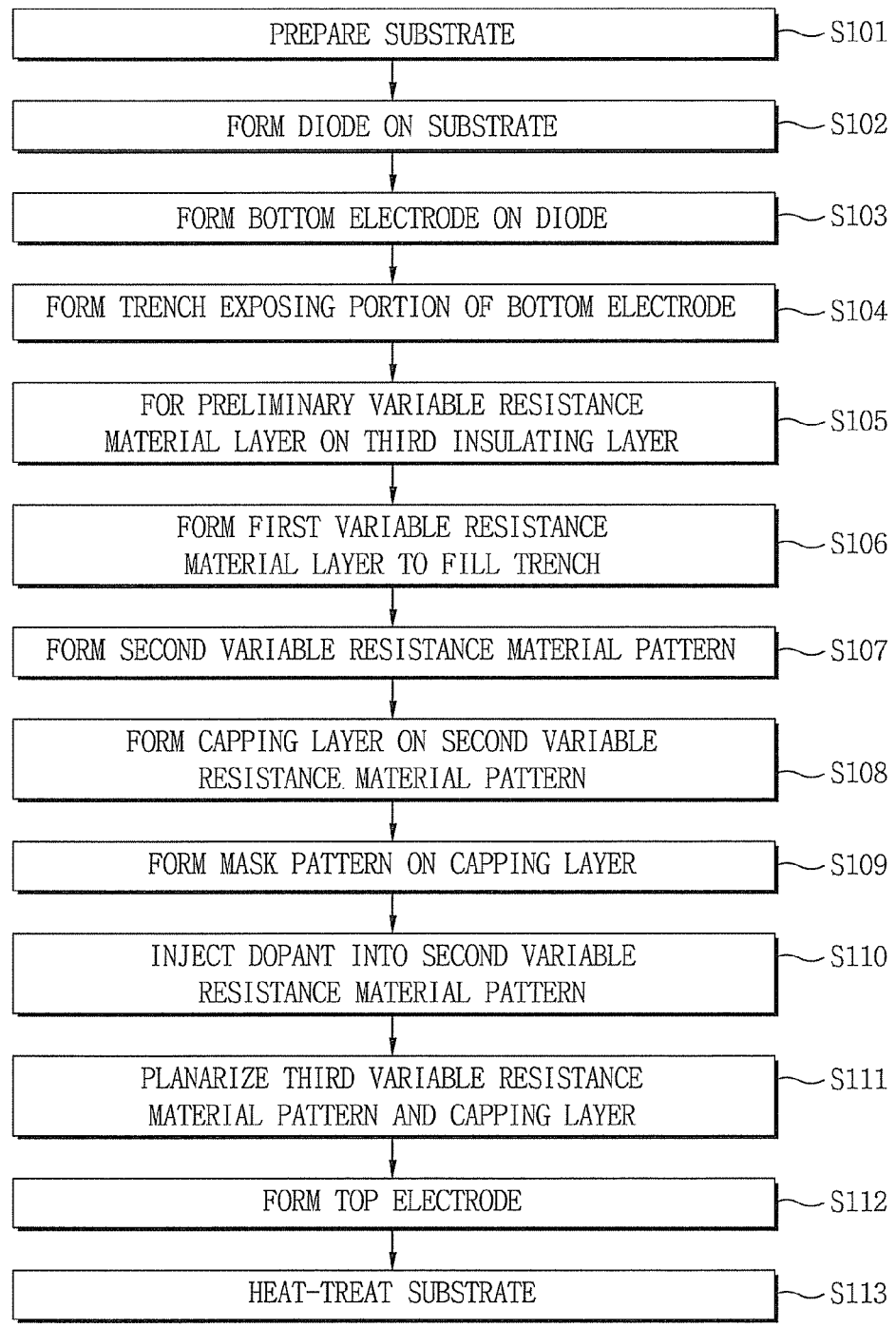
FIG. 23 is a flowchart illustrating the method of manufacturing the variable resistance memory device according to the first example embodiment of the inventive concepts.

After that, as illustrated in FIG. 22, the method of manufacturing the variable resistance memory device according to the first example embodiment of the inventive concepts may include forming a contact plug 220 in the second opening 215.

The contact plug 220 may be formed of titanium (Ti), titanium nitride (TiN), titanium aluminum nitride (TiAlN), titanium silicon nitride (TiSiN), titanium carbon nitride (TiCN), tantalum (Ta), tantalum nitride (TaN), tantalum aluminum nitride (TaAlN), tantalum silicon nitride (TaSiN), tantalum carbon nitride (TaCN), cobalt (Co), cobalt silicon nitride (CoSiN), tungsten (W), tungsten nitride (WN), tungsten silicon nitride (WSiN), nickel (Ni), nickel silicon (NiSi), carbon (C), carbon nitride (CN) or a combination thereof.

Next, as illustrated in FIG. 2, the method of manufacturing the variable resistance memory device according to the first example embodiment of the inventive concepts may include forming a bit line 230 on the contact plug 220. The bit line 230 may be formed of the same material as the contact plug 220, but example embodiments are not limited thereto.

SECOND EXAMPLE EMBODIMENT

FIGS. 24 through 27 are cross-sectional views sequentially illustrating a method of manufacturing a variable resistance memory device according to a second example embodiment of the inventive concepts. FIG. 28 is a flowchart illustrating the method of manufacturing the variable resistance memory device according to the second example embodiment of the inventive concepts.

The method of manufacturing the variable resistance memory device according to the second example embodiment of the inventive concepts will be described below with reference to FIGS. 2 and 24 through 28. Difference between the method of manufacturing the variable resistance memory device according to the second embodiment and that according to the first embodiment will be mainly described.

Figure 24:
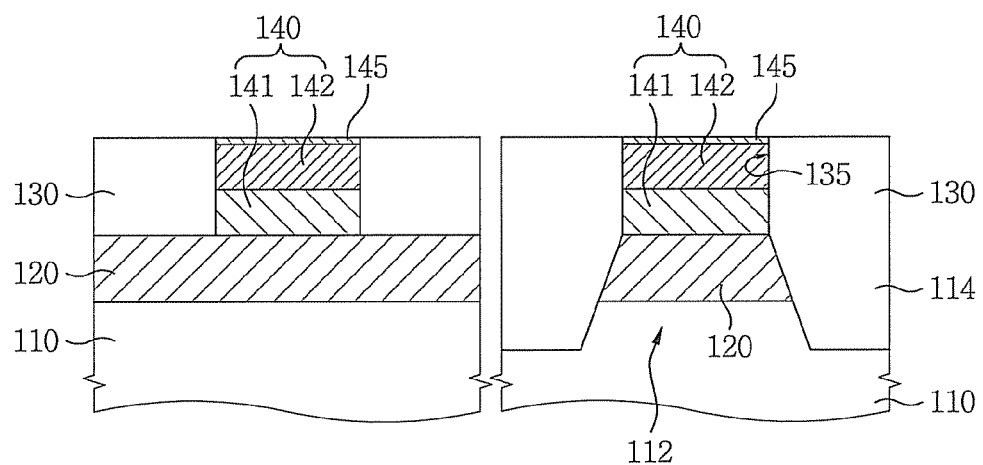
FIGS. 24 through 27 are cross-sectional views sequentially illustrating a method of manufacturing a variable resistance memory device according to a second example embodiment of the inventive concepts.

First, as illustrated in FIG. 24 and described in FIG. 28, the method of manufacturing the variable resistance memory device according to the second example embodiment of the inventive concepts may include preparing a substrate 110 including a diode 140 which is electrically connected with an active region 112 (S201). Herein, the word line 120 may be formed in the active region 112. The diode 140 may be in contact with the word line 120.

Next, the method of manufacturing the variable resistance memory device according to the second example embodiment of the inventive concepts may include forming a diode electrode 145 on the diode 140 (S202). The diode electrode 145 may be formed in a first contact hole 135.

The diode electrode 145 may be formed of at least one of titanium (Ti), titanium silicon (TiSi), titanium nitride (TiN), titanium oxynitride (TiON), titanium tungsten (TiW), titanium aluminum nitride (TiAlN), titanium aluminum oxynitride (TiAlON), titanium silicon nitride (TiSiN), tungsten (W), tungsten nitride (WN), tungsten oxynitride (WON), tungsten silicon nitride (WSiN), tungsten carbon nitride (WCN), silicon (Si), tantalum (Ta), tantalum silicon (TaSi), tantalum nitride (TaN), tantalum oxynitride (TaON), tantalum aluminum nitride (TaAlN), tantalum silicon nitride (TaSiN), tantalum carbon nitride (TaCN), molybdenum (Mo), molybdenum nitride (MoN), molybdenum silicon nitride (MoSiN), molybdenum aluminum nitride (MoAlN), cobalt (Co), cobalt silicon (CoSi), nickel silicon (NiSi), conductive carbon group, copper (Cu) or a combination thereof. The diode electrode 145 may be metal silicide.

Then, the method of manufacturing the variable resistance memory device according to the second example embodiment of the inventive concepts may include forming a bottom electrode 160 on the diode electrode 145 (S203), forming a third insulating layer 170 including a first opening 175 on the bottom electrode 160 (S204), forming a preliminary variable resistance material layer 181 on the third insulating layer 170 (S205), and forming a first variable resistance material layer 182 to fill the first opening 175 (S206).

Figure 25:
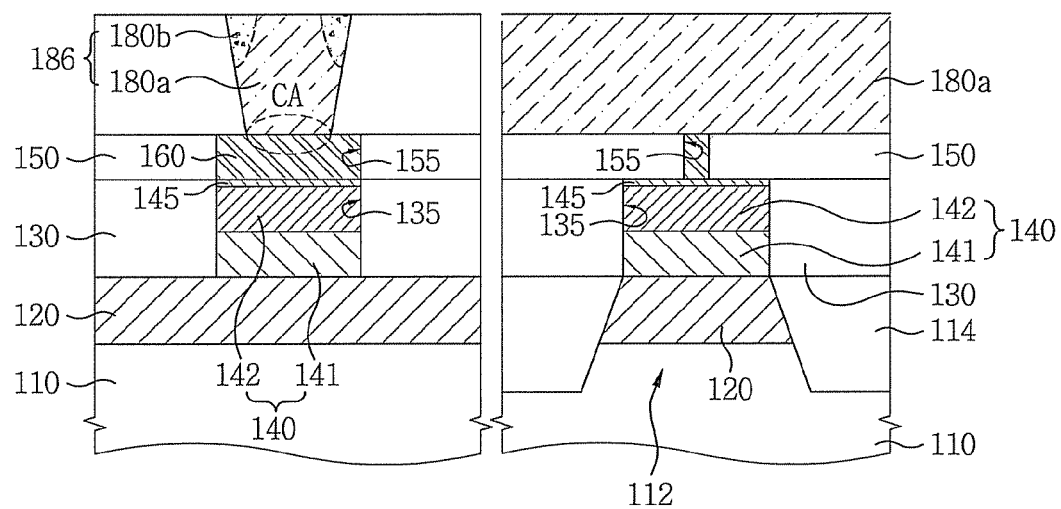

After that, as illustrated in FIG. 25, the method of manufacturing the variable resistance memory device according to the second example embodiment of the inventive concepts may include forming a fifth variable resistance material pattern 186 by planarizing the first variable resistance material layer 182 until a top surface of the third insulating layer 170 is exposed (S207). Forming the fifth variable resistance material pattern 186 may include CMP, but example embodiments are not limited thereto.

Figure 26:
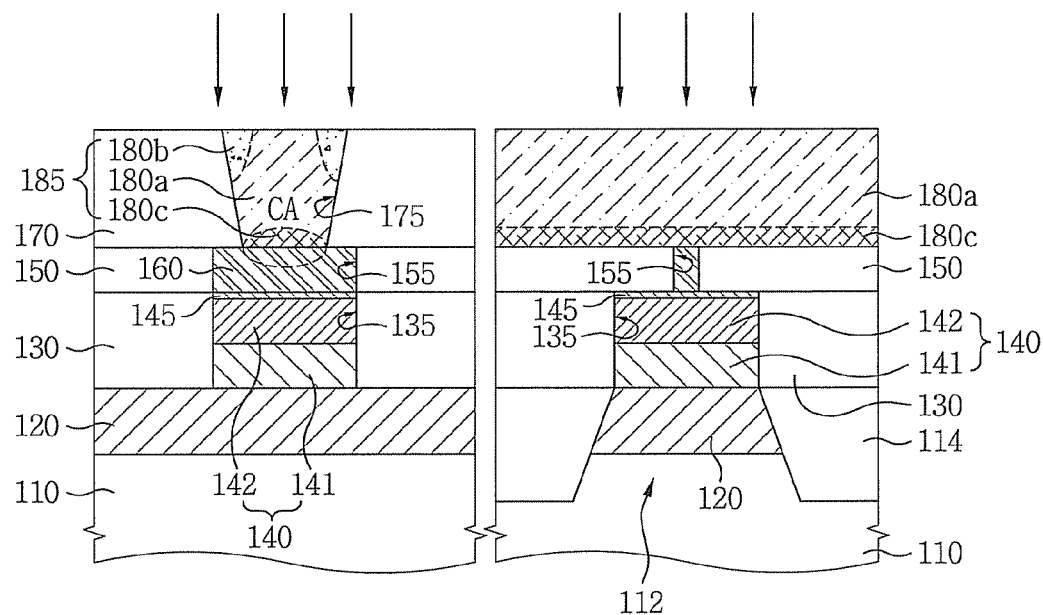

Next, as illustrated in FIG. 26, the method of manufacturing the variable resistance memory device according to the second example embodiment of the inventive concepts may include forming a fourth variable resistance material pattern 185 by doping the fifth variable resistance material pattern 186 with a dopant (S208).

Figure 27:
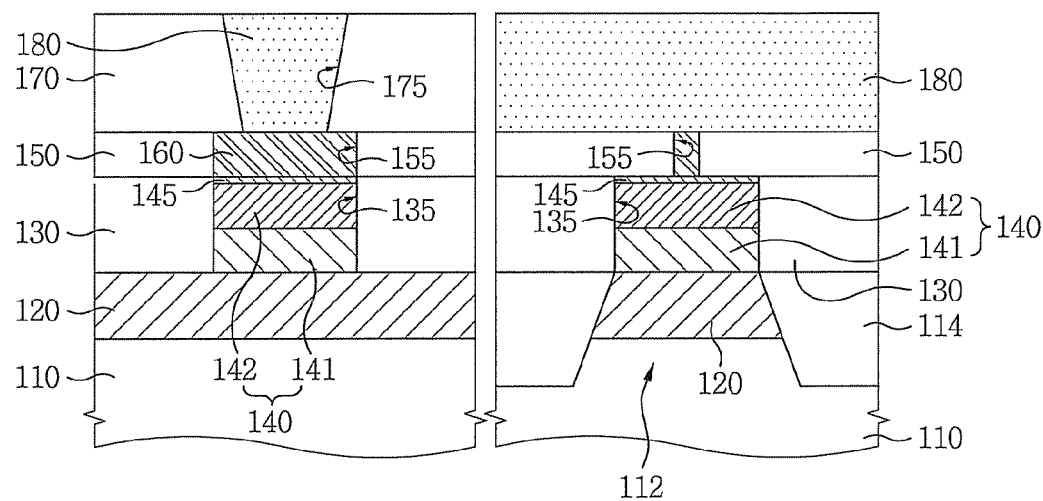
Figure 28:
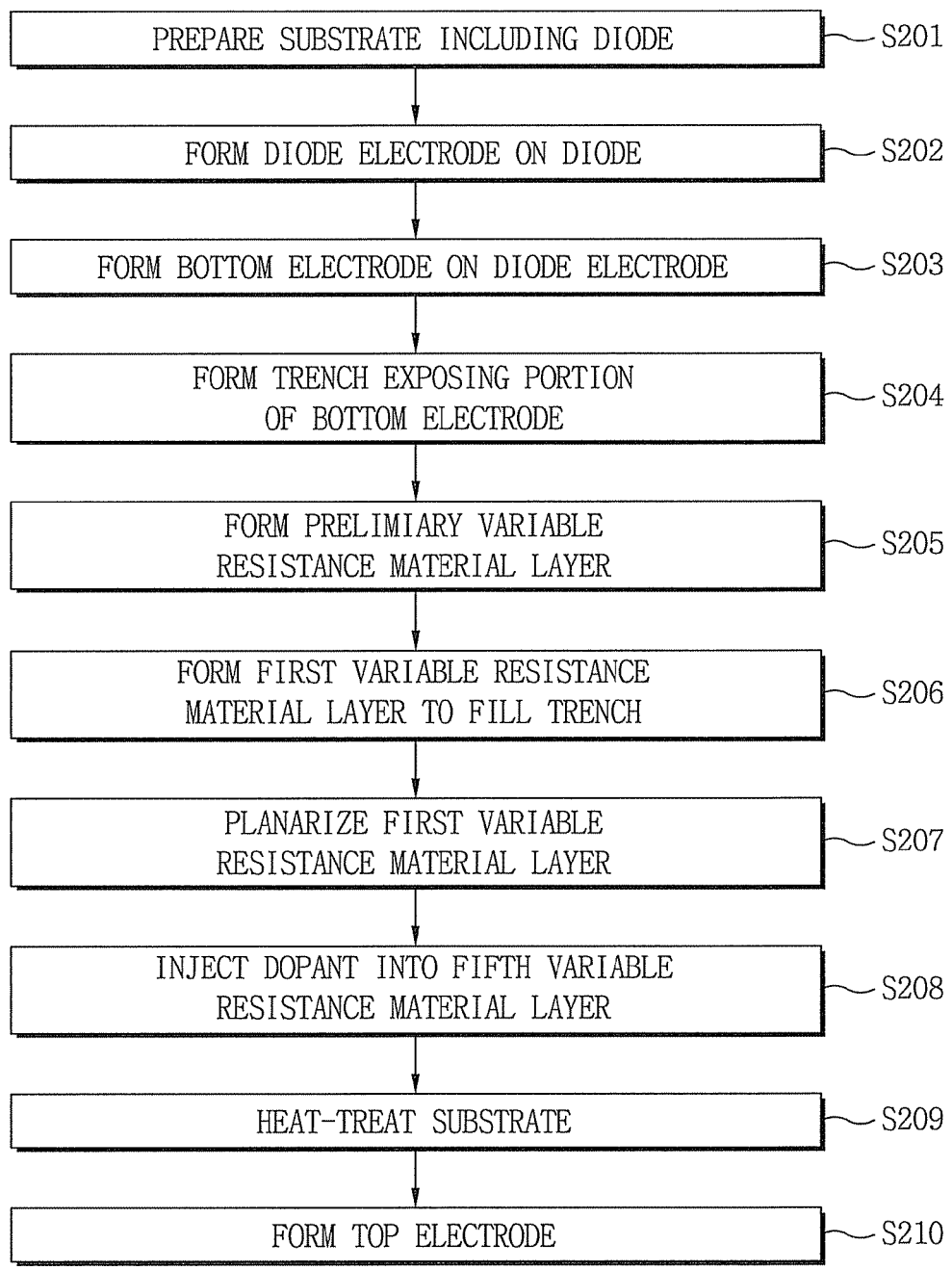
FIG. 28 is a flowchart illustrating the method of manufacturing the variable resistance memory device according to the second example embodiment of the inventive concepts.

Then, as illustrated in FIG. 27, the method of manufacturing the variable resistance memory device according to the second example embodiment of the inventive concepts may include forming a first variable resistance material pattern 180 by heat-treating the substrate 110 at a third processing temperature (S209). Herein, the third processing temperature may be a temperature that limits and/or prevents vaporization of a plurality of elements composing the fourth variable resistance material pattern 185. The third processing temperature may be the same as a first processing temperature for forming the preliminary variable resistance material layer 181. For example, the third processing temperature may be 250° C. to 350° C.

After that, as illustrated in FIG. 2, the method of manufacturing the variable resistance memory device according to the second example embodiment of the inventive concepts may include forming a top electrode 200 on the first variable resistance material pattern 180 (S210), forming a contact plug 220 on the top electrode 200 and forming a bit line 230 on the contact plug 220.

THIRD EXAMPLE EMBODIMENT

FIGS. 29 through 34 are cross-sectional views sequentially illustrating a method of manufacturing a variable resistance memory device according to a third example embodiment of the inventive concepts. FIG. 35 is a flowchart illustrating the method of manufacturing the variable resistance memory device according to the third example embodiment of the inventive concepts.

The method of manufacturing the variable resistance memory device according to the third example embodiment of the inventive concepts will be described below with reference to FIGS. 2 and 29 through 35 mainly in terms of difference between the method of manufacturing the variable resistance memory device according to the third embodiment and that according to the first embodiment.

Figure 29:
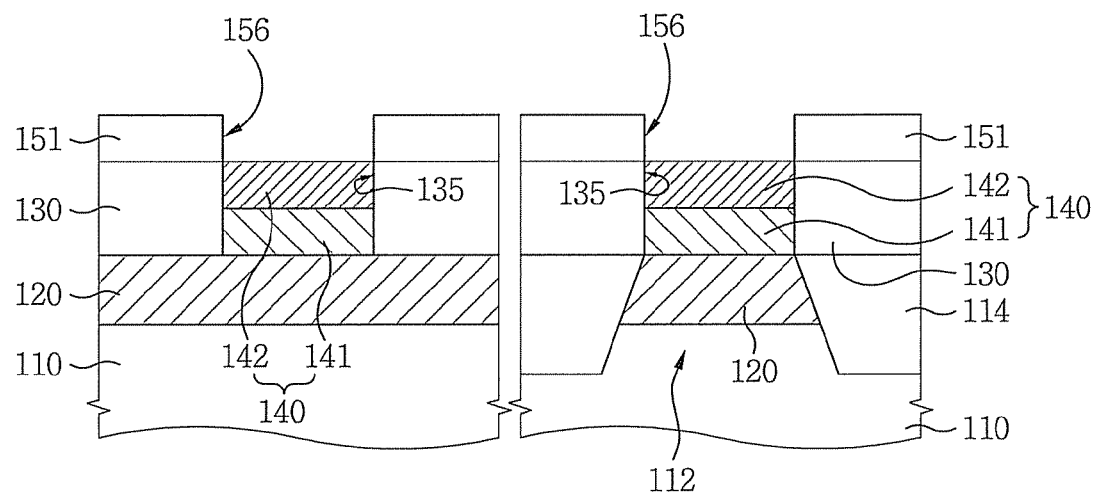
FIGS. 29 through 34 are cross-sectional views sequentially illustrating a method of manufacturing a variable resistance memory device according to a third example embodiment of the inventive concepts.

First, as illustrated in FIG. 29 and described in FIG. 35, the method of manufacturing the variable resistance memory device according to the third example embodiment of the inventive concepts may include preparing a substrate 110 including a diode 140 (S301). Herein, the diode 140 may be electrically connected with an active region 112 of the substrate 110. A word line 120 may be formed in the active region 112.

Next, the method of manufacturing the variable resistance memory device according to the third example embodiment of the inventive concepts may include forming a fifth insulating layer 151 including a fifth contact hole 156 on the first insulating layer 130 (S302). The diode 140 may be exposed through the fifth contact hole 156.

Figure 30:
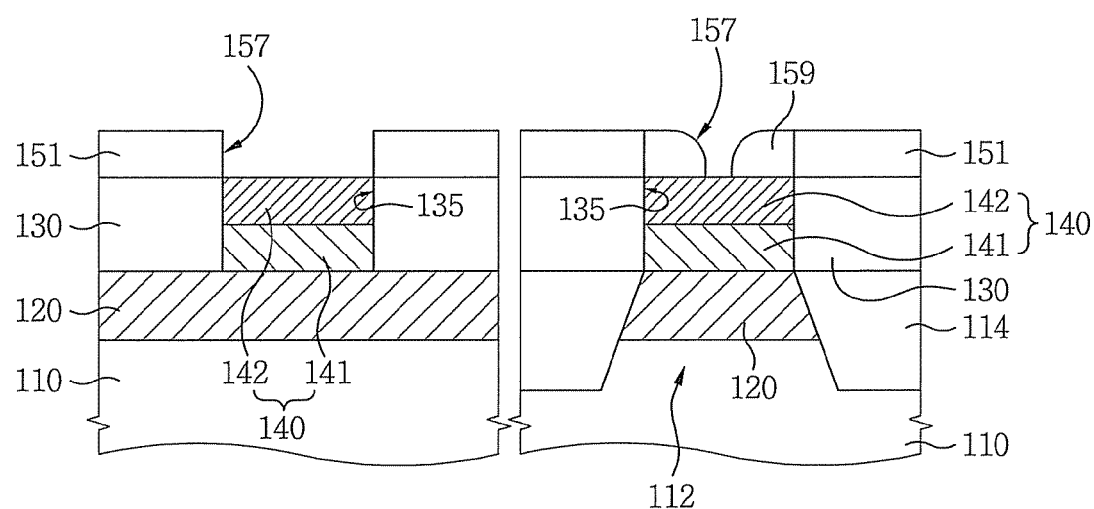

Then, as illustrated in FIG. 30, the method of manufacturing the variable resistance memory device according to the third example embodiment of the inventive concepts may include forming a spacer 159 along a sidewall of the fifth contact hole 156 (S303). The fifth contact hole 156 may become a sixth contact hole 157 which has a relatively narrow width.

The spacer 159 may be formed of a silicon oxide (SiO) layer, a silicon nitride (SiN) layer, a silicon oxynitride (SiON) layer or a combination thereof. The spacer 159 may be formed of the same material as the fifth insulating layer 151.

Figure 31:
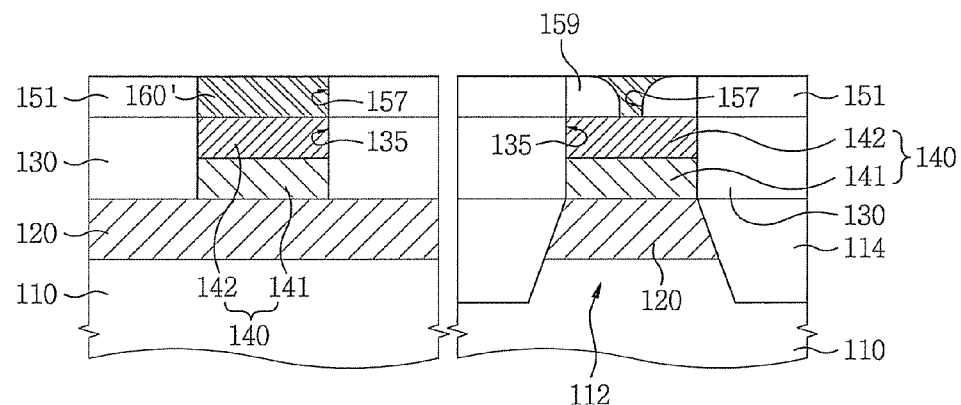

After that, as illustrated in FIG. 31, the method of manufacturing the variable resistance memory device according to the third example embodiment of the inventive concepts may include forming a bottom electrode 160' to fill the sixth contact hole 157 on the fifth insulating layer 151 (S304).

Figure 32:
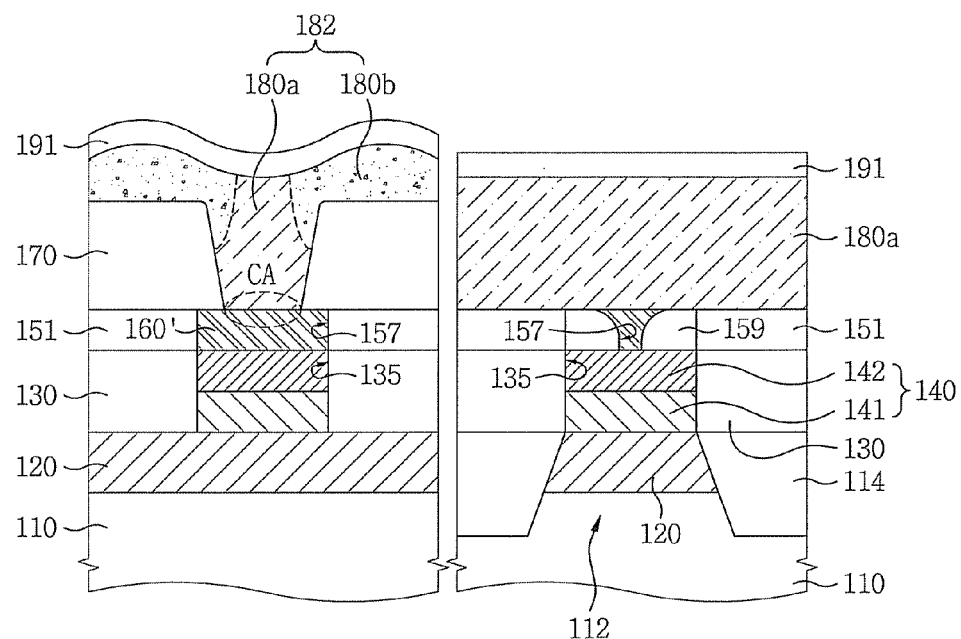

Next, as illustrated in FIG. 32, the method of manufacturing the variable resistance memory device according to the third example embodiment of the inventive concepts may include forming a third insulating layer 170 including the first opening 175 on the bottom electrode 160' (S305), forming a preliminary variable resistance material layer 181 on the third insulating layer 170 (S306), forming a first variable resistance material layer 182 to fill the first opening 175 (S307), and forming a capping layer 191 on the first variable resistance material layer 182 (S308).

Figure 33:
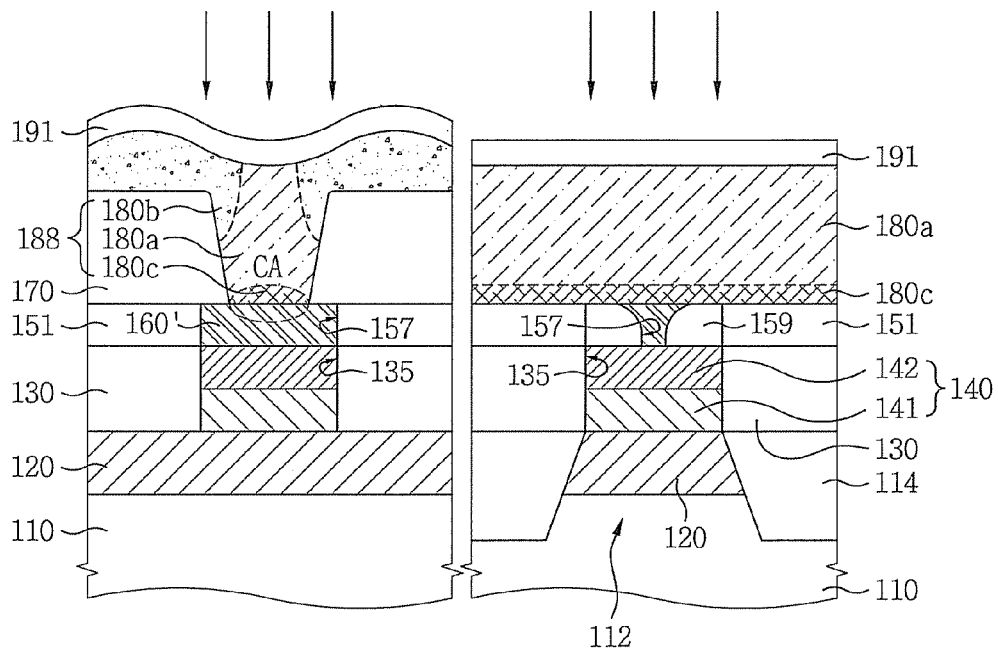
Figure 34:
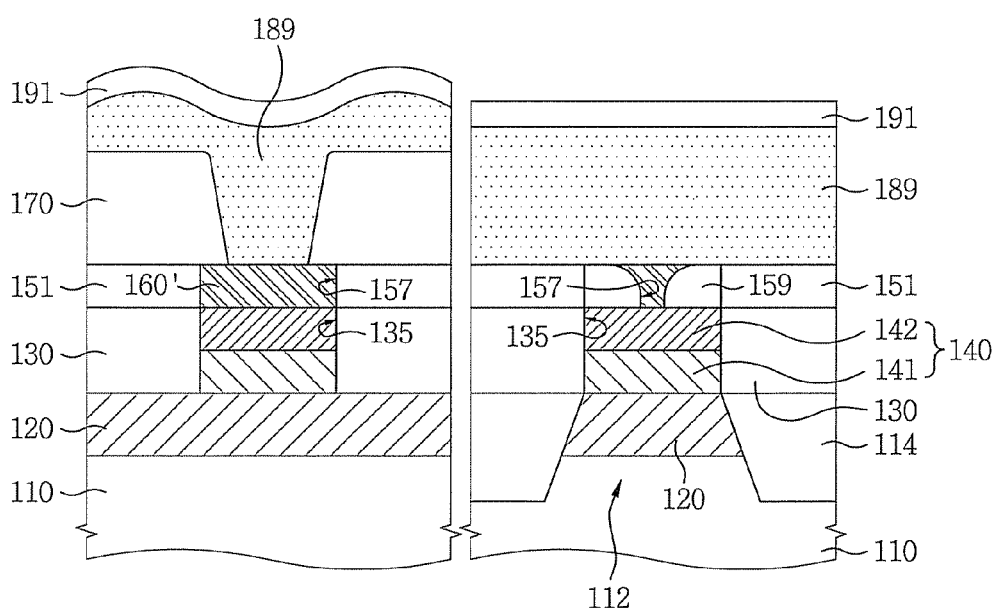
Figure 35:
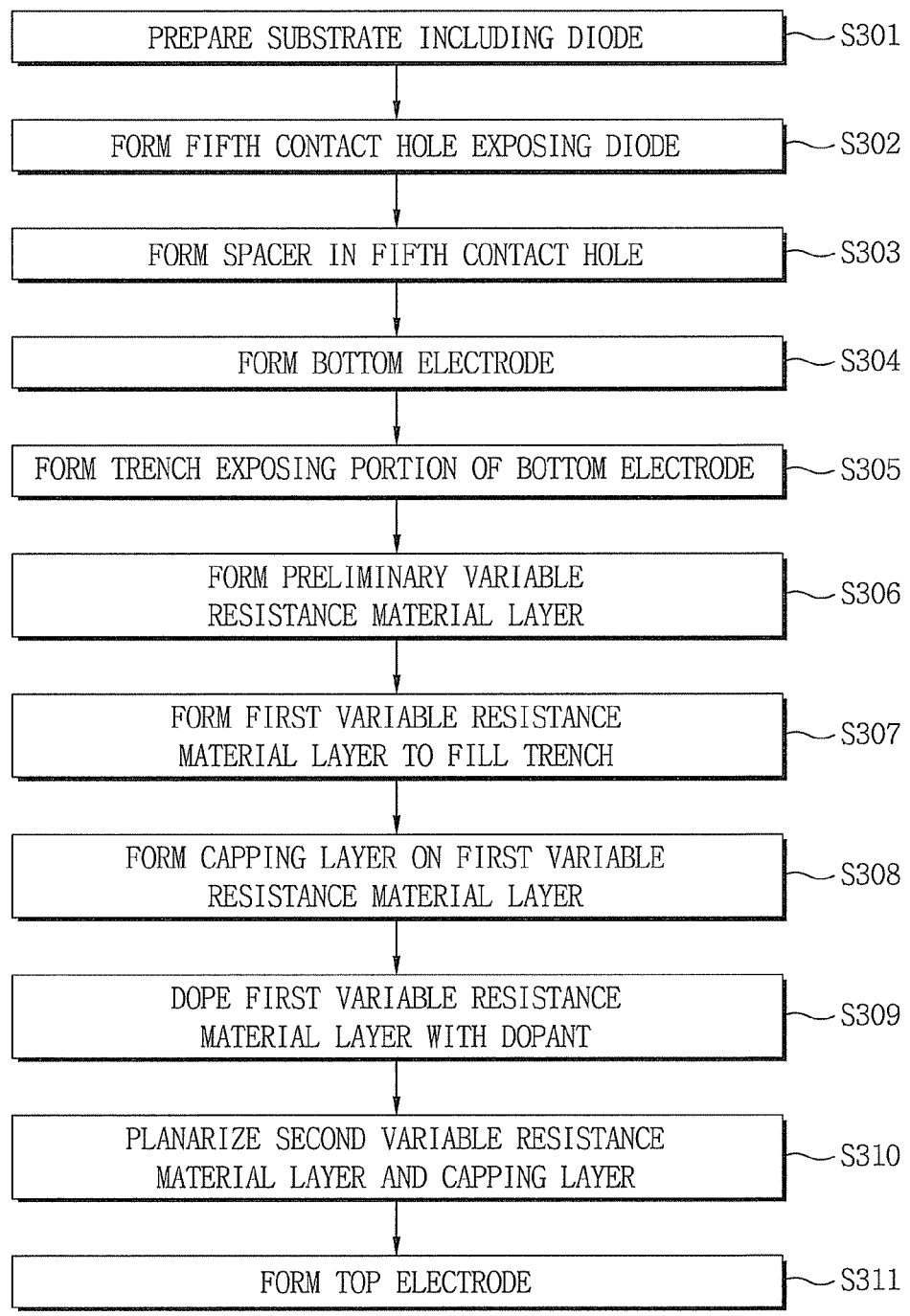
FIG. 35 is a flowchart illustrating the method of manufacturing the variable resistance memory device according to the third example embodiment of the inventive concepts.

Then, as illustrated in FIGS. 33 and 34, the method of manufacturing the variable resistance memory device according to the third example embodiment of the inventive concepts may include doping the first variable resistance material layer 182 with a dopant (S309). Doping the dopant may include of injecting the dopant and heat-treating the substrate 110.

After that, the method of manufacturing the variable resistance memory device according to the third example embodiment of the inventive concepts may include forming a first variable resistance material pattern 180 by planarizing a third variable resistance material layer 189 until the top surface of the third insulating layer 170 is exposed as illustrated in FIG. 2. Planarizing the third variable resistance material layer 189 may include CMP, but example embodiments are not limited thereto.

Next, the method of manufacturing the variable resistance memory device according to the third example embodiment of the inventive concepts may include forming a top electrode 200 on the first variable resistance material pattern 180 (S311), forming a contact plug 220 on the top electrode 200, and forming a bit line 230 on the contact plug 220.

FOURTH EXAMPLE EMBODIMENT

FIGS. 36 through 39 are cross-sectional views sequentially illustrating a method of manufacturing a variable resistance memory device according to a fourth example embodiment of the inventive concepts. FIG. 40 is a flowchart illustrating the method of manufacturing the variable resistance memory device according to the fourth example embodiment of the inventive concepts.

The method of manufacturing the variable resistance memory device according to the fourth example embodiment of the inventive concepts will be described below with reference to FIGS. 2 and 36 through 40 mainly in terms of differences between the method of manufacturing the variable resistance memory device according to the fourth embodiment and that according to the first embodiment.

Figure 36:
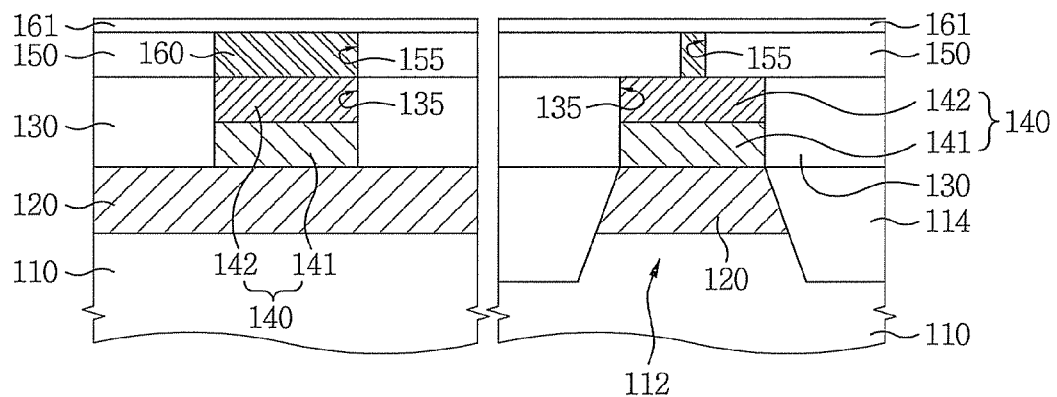
FIGS. 36 through 39 are cross-sectional views sequentially illustrating a method of manufacturing a variable resistance memory device according to a fourth example embodiment of the inventive concepts.

First, as illustrated in FIG. 36 and described in FIG. 40, the method of manufacturing the variable resistance memory device according to the fourth example embodiment of the inventive concepts may include preparing a substrate 110 including a diode 140 and a bottom electrode 160 (S401). Herein, the bottom electrode 160 may be electrically connected with an active region 112 of the substrate 110 through the diode 140.

Next, the method of manufacturing the variable resistance memory device according to the fourth example embodiment of the inventive concepts may include forming a first etching stopper 161 on the bottom electrode 160 (S402).

Figure 37:
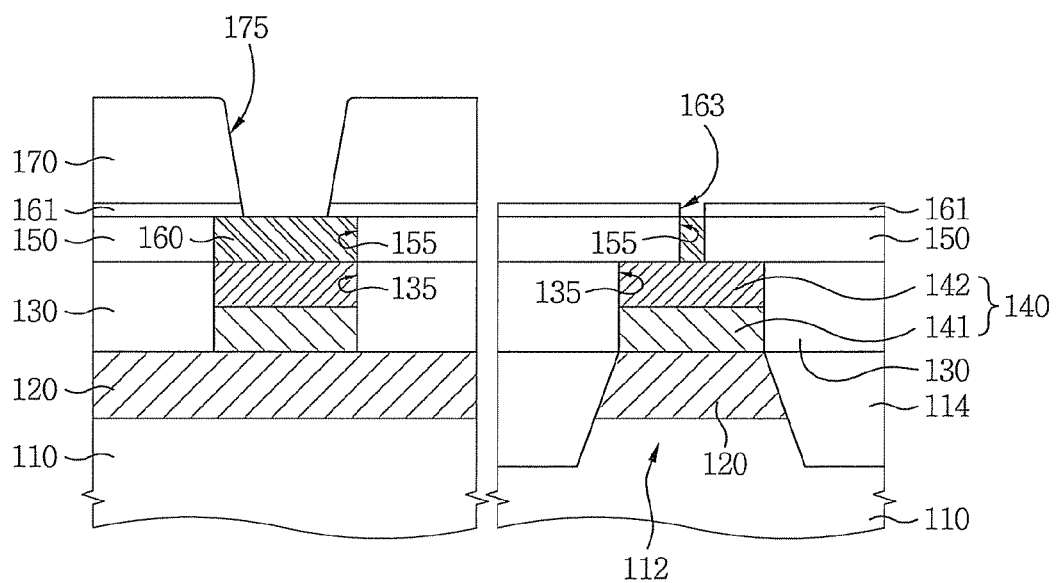

Then, as illustrated in FIG. 37, the method of manufacturing the variable resistance memory device according to the fourth example embodiment of the inventive concepts may include forming a third insulating layer 170 including a first opening 175 on the bottom electrode 160 (S403). The first etching stopper 161 may include a hole 163 exposing a portion of the bottom electrode 160.

Figure 38:
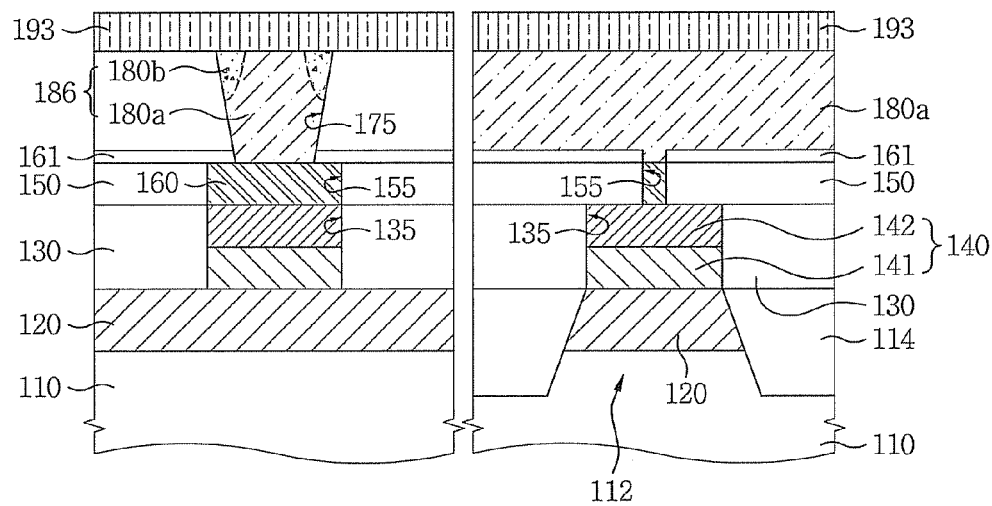

After that, as illustrated in FIG. 38, the method of manufacturing the variable resistance memory device according to the fourth example embodiment of the inventive concepts may include forming a preliminary variable resistance material layer 181 on the third insulating layer 170 (S404), and forming a first variable resistance material layer 182 to fill the first opening 175 (S405).

Next, the method of manufacturing the variable resistance memory device according to the fourth example embodiment of the inventive concepts may include forming a fifth variable resistance material pattern 186 by planarizing the first variable resistance material layer 182 (S406).

Then, the method of manufacturing the variable resistance memory device according to the fourth example embodiment of the inventive concepts may include forming a diffusion source layer 193 on the fifth variable resistance material pattern 186 (S407). The diffusion source layer 193 may include at least one element which has a relatively high heat of vaporization among a plurality of elements composing the preliminary variable resistance material layer 181.

Figure 39:
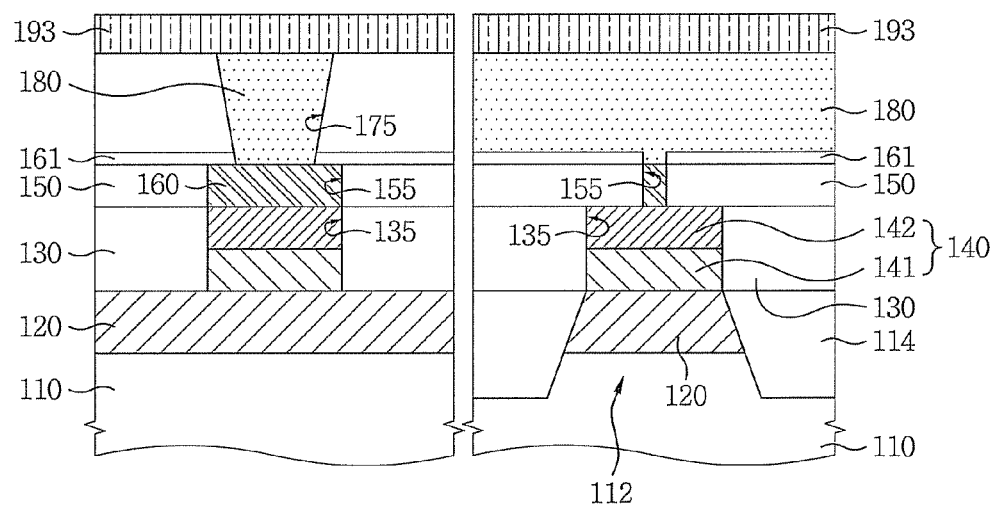
Figure 40:
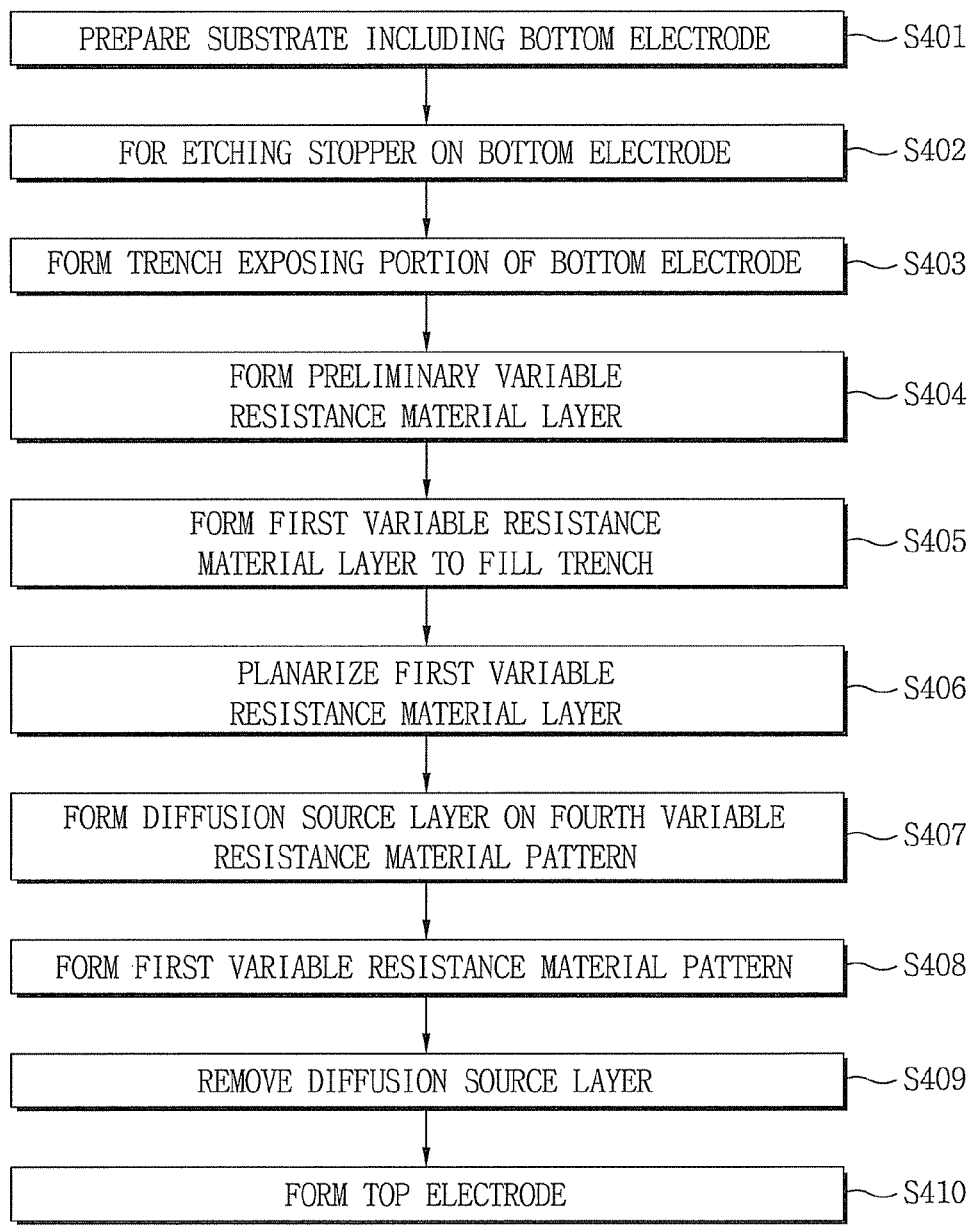
FIG. 40 is a flowchart illustrating the method of manufacturing the variable resistance memory device according to the fourth example embodiment of the inventive concepts.

After that, as illustrated in FIG. 39, the method of manufacturing the variable resistance memory device according to the fourth example embodiment of the inventive concepts may include forming a first variable resistance material pattern 180 using the diffusion source layer 193 (S408).

Forming the first variable resistance material pattern 180 may include heat-treating the substrate 110 at a third processing temperature. The heat treatment of the substrate 110 may diffuse a plurality of elements composing the diffusion source layer 193 to the fifth variable resistance material pattern 186. The fifth variable resistance material pattern 186 may be doped with at least one element which has a relatively high heat of vaporization among the plurality of elements composing the preliminary variable resistance material layer 181.

Next, as illustrated in FIG. 2, the method of manufacturing the variable resistance memory device according to the fourth example embodiment of the inventive concepts may include removing the diffusion source layer 193 (S409), forming a top electrode 200 on the first variable resistance material pattern 180 (S410), forming a contact plug 220 on the top electrode 200, and forming a bit line 230 on the contact plug 220.

FIFTH EXAMPLE EMBODIMENT

Figure 41:
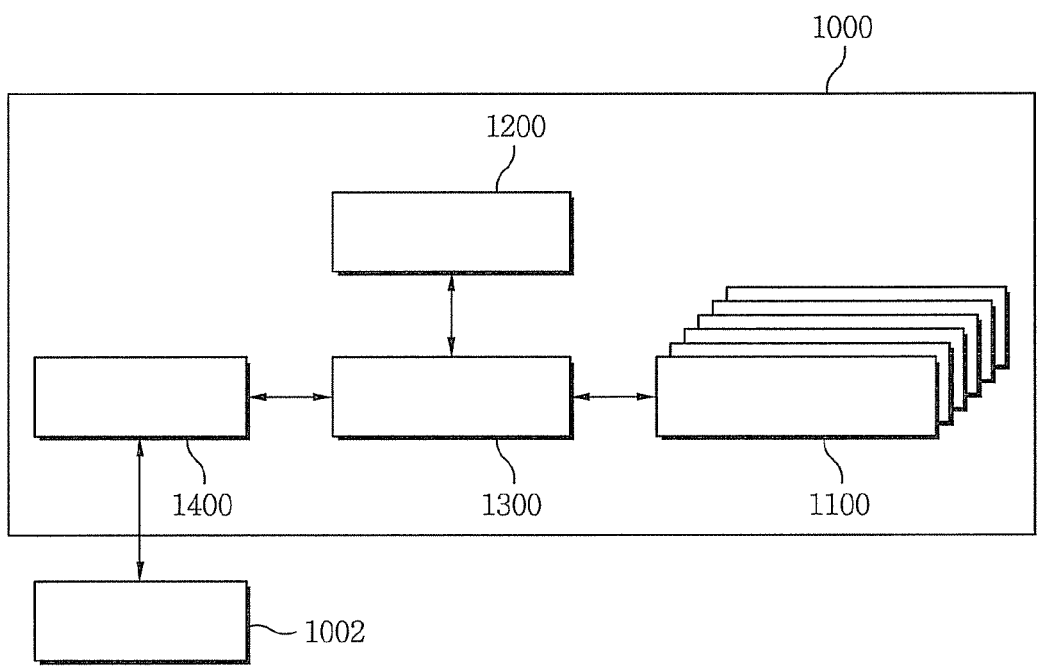
FIG. 41 is a block diagram of a data storage device including a variable resistance memory device manufactured by a method according to some example embodiments of the inventive concepts.

FIG. 41 is a block diagram of a data storage device including a variable resistance memory device manufactured by a method according to example embodiments of the inventive concepts. The data storage device may be a solid state disk (SSD) 1000.

Referring to FIG. 41, the SSD 1000 may include a non-volatile memory 1100, a buffer memory 1200, a controller 1300 and an interface 1400. The non-volatile memory 1100 may include the variable resistance memory device manufactured by a method according to example embodiments of the inventive concepts. For example, the non-volatile memory 1100 may include memory cells which have a similar construction as illustrated in FIG. 2.

The SSD 1000 is an apparatus which stores information using a semiconductor device. Compared with a hard disk drive (HDD), the SSD 1000 operates at high speed, has a reduced mechanical delay and failure rate, generates less heat and noise, and can be compact and lightweight. The SSD 1000 may be used in laptop computers, desktop computers, moving picture experts group (MPEG) layer-3 (MP3) players or portable storage devices.

The controller 1300 may be formed adjacent to the interface 1400 and electrically connected to the interface 1400. The controller 1300 may be a microprocessor including a memory controller and a buffer controller. The non-volatile memory 1100 may be formed adjacent to the controller 1300 and electrically connected to the controller 1300. The SSD 1000 may have data storage capacity corresponding to that of the non-volatile memory 1100. The buffer memory 1200 may be formed adjacent to the controller 1300 and electrically connected to the controller 1300.

The interface 1400 may access a host 1002 and serve to transmit and receive electrical signals such as data. For example, the interface 1400 may be an apparatus using a standard such as serial advanced technology attachment (SATA), integrated drive electronics (IDE), small computer system interface (SCSI) and/or a combination thereof. The non-volatile memory 1100 may be connected to the interface 1400 via the controller 1300. The non-volatile memory 1100 may serve to store data received through the interface 1400. Even if the supply of power to the data storage device is interrupted, data stored in the non-volatile memory 1100 is retained.

The buffer memory 1200 may include a volatile memory. The volatile memory may be a dynamic random access memory (DRAM) and/or a static random access memory (SRAM). The buffer memory 1200 may exhibit a higher operating speed than the non-volatile memory 1100.

The data processing speed of the interface 1400 may be higher than the operating speed of the non-volatile memory 1100. Herein, the buffer memory 1200 may serve to temporarily store data. After data received through the interface 1400 is temporarily stored in the buffer memory 1200 via the controller 1300, the received data may be permanently stored in the non-volatile memory 1100 according to a data write speed of the non-volatile memory 1100. Also, frequently used data among data stored in the non-volatile memory 1100 may be previously read and temporarily stored in the buffer memory 1200. In other words, the buffer memory 1200 may serve to increase an effective operating speed of the SSD 1000 and decrease error rate.

SIXTH EXAMPLE EMBODIMENT

Figure 42:
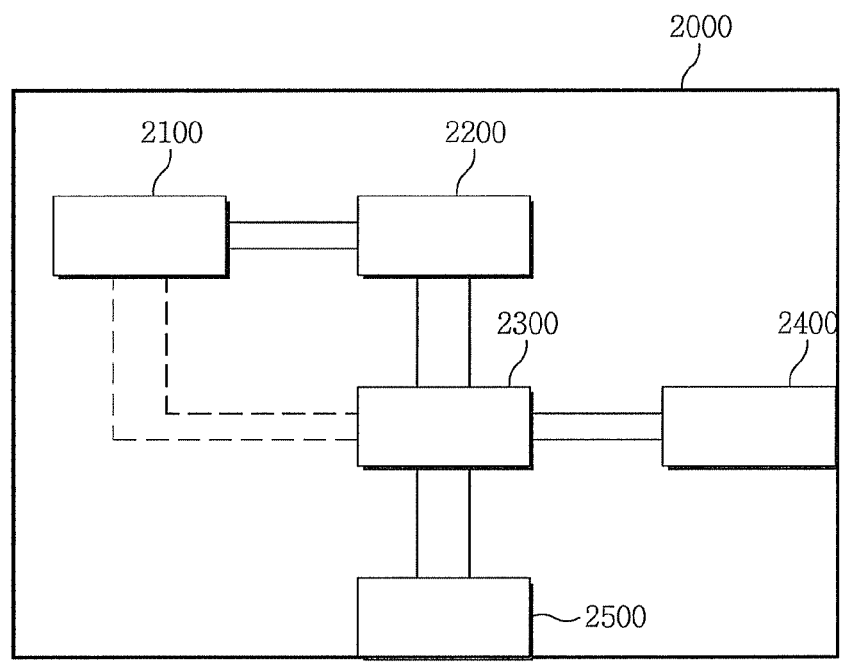
FIG. 42 is a block diagram of a mobile device including a variable resistance memory device manufactured by a method according to some example embodiments of the inventive concepts.

FIG. 42 is a block diagram of a mobile device 2000 including a variable resistance memory device manufactured by a method according to example embodiments of the inventive concepts.

Referring to FIG. 42, a mobile device 2000 according to example embodiments of the inventive concepts may include a memory 2100, a memory controller 2200, an encoder and decoder error detection code (EDC) 2300, a presentation component 2400 and an interface 2500.

The memory 2100 may be a non-volatile memory device including a variable resistance memory device manufactured by a method according to example embodiments of the inventive concepts. The memory controller 2200 may be electrically connected with the memory 2100. The encoder and decoder EDC 2300 may be electrically connected with the memory 2100 and the memory controller 2200.

The encoder and decoder EDC 2300 may exchange data with the memory 2100 through the memory controller 2200. The encoder and decoder EDC 2300 may directly exchange data with the memory 2100 along a dotted line. In this case, the encoder and decoder EDC 2300 may encode data and store the encoded data in the memory 2100.

Furthermore, the encoder and decoder EDC 2300 may decode output data of the memory 2100. The encoder and decoder EDC 2300 may be electrically connected with the presentation component 2400 and the interface 2500. The presentation component 2400 may present data of the memory 2100 decoded by the encoder and decoder EDC 2300 to a user.

The interface 2500 may exchange data with the encoder and decoder EDC 2300. The interface 2500 may output data of the memory 2100. The mobile device 2000 may include an MP3 player, a video player, a video and an audio player.

SEVENTH EXAMPLE EMBODIMENT

Figure 43:
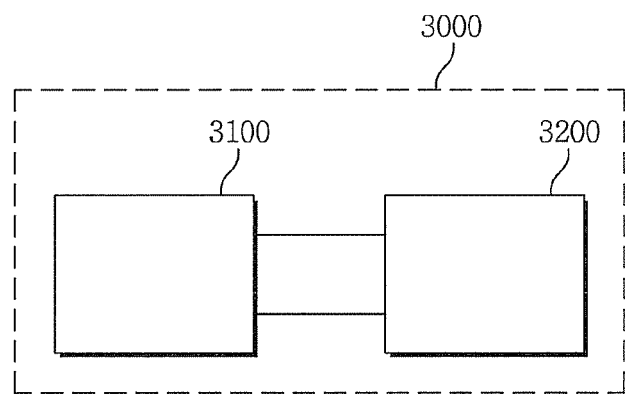
FIG. 43 is a block diagram of a computer system including a variable resistance memory device manufactured by a method according to some example embodiments of the inventive concepts.

FIG. 43 is a block diagram of a computer system including a variable resistance memory device manufactured by a method according to example embodiments of the inventive concepts.

Referring to FIG. 43, a computer system 3000 according to example embodiments of the inventive concepts may include a central processing unit (CPU) 3100 and a memory 3200. The central processing unit 3100 may be electrically connected with the memory 3200. The memory 3200 may be a non-volatile memory device including a variable resistance memory device manufactured by a method according to example embodiments of the inventive concepts.

The computer system 3000 may include a personal computer and a personal data assistant.

EIGHTH EXAMPLE EMBODIMENT

Figure 44:
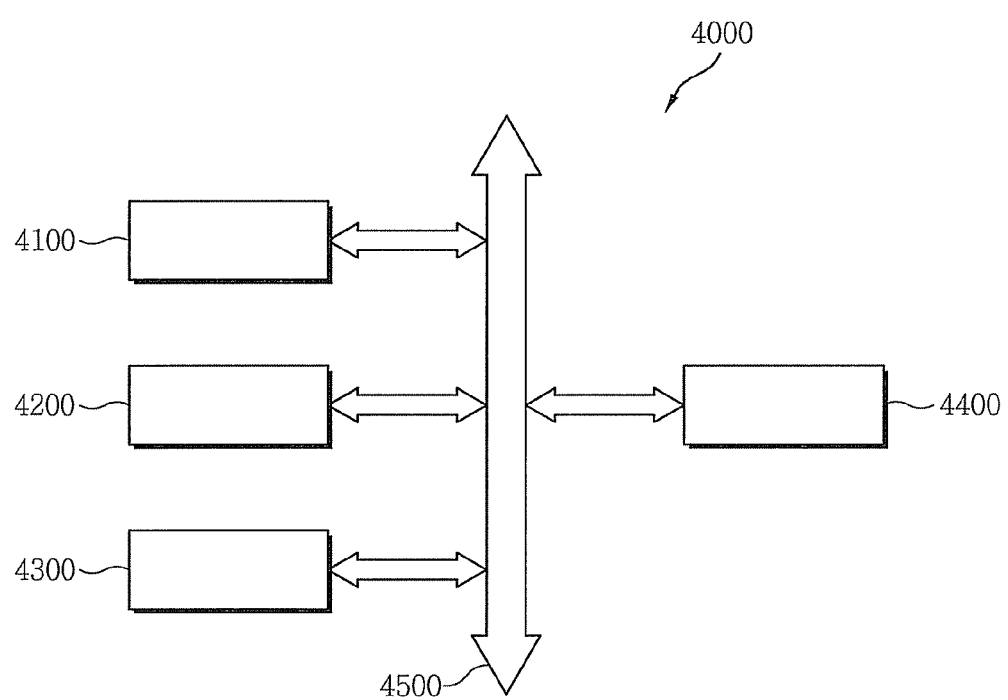
FIG. 44 is a block diagram of an electrical system including a variable resistance memory device manufactured by a method according to some example embodiments of the inventive concepts.

FIG. 44 is a block diagram of an electrical system including a variable resistance memory device manufactured by a method according to example embodiments of the inventive concepts.

Referring to FIG. 44, a mobile system 4000 according to example embodiments of the inventive concepts may include an interface 4100, a memory 4200, an input/output (I/O) device 4300 and a controller 4400. The interface 4100 may be electrically connected with the memory 4200, the I/O device 4300 and the controller 4400 through a bus 4500.

The interface 4100 may exchange data with an external system. The memory 4200 may be a non-volatile memory device including a variable resistance memory device manufactured by a method according to example embodiments of the inventive concepts. The memory 4200 may store a command which is executed by data and/or the controller 4400.

The controller 4400 may include a microprocessor, a digital processor, or a microcontroller. The mobile system 4000 may include a personal digital assistant (PDA), a portable computer, a web tablet, a wireless phone, a mobile phone, or a digital music player.

While some example embodiments have been particularly shown and described, it will be understood by one of ordinary skill in the art that variations in form and detail may be made therein without departing from the spirit and scope of the claims.

What is claimed is:

1. A method of manufacturing a variable resistance memory device, comprising:
    forming a bottom electrode on a substrate;
    forming an insulating layer on the substrate,
        the insulating layer defining a first opening that exposes a portion of the bottom electrode;
    forming a first variable resistance material layer to fill the first opening,
        the first variable resistance material layer including a plurality of elements;
    forming a second variable resistance material layer including a first region disposed in the first opening, and a second region disposed on the first region and the insulating layer by removing a seam of the first variable resistance material layer,
    the first region having a relatively low ratio of at least one element having a heat of vaporization that is greater than a different element among the plurality of elements, and
    the second region having a relatively high ratio of the at least one element having a heat of vaporization that is greater than a different element among the plurality of elements;
    forming a variable resistance material pattern by patterning the second variable resistance material layer,
    the variable resistance material pattern including the first region and the second region;
    doping the first region and the second region of the variable resistance material pattern with a dopant,
    the dopant including the at least one element among the plurality of elements; and
    forming a top electrode on the variable resistance material pattern,
    wherein
    the dopant includes the at least one element having a heat of vaporization that is greater than a different element among the plurality of elements.

2. The method of claim 1, wherein
    the doping the variable resistance material pattern includes injecting the dopant into the variable resistance material pattern.

3. The method of claim 2, wherein
    the injecting the dopant into the variable resistance material pattern includes injecting the dopant into an interface between the variable resistance material pattern and the bottom electrode.

4. The method of claim 2, further comprising:
    heat-treating the substrate before forming the top electrode.

5. The method of claim 2, further comprising:
    forming a mask pattern on the insulating layer before injecting the dopant,
    the mask pattern defining a second opening that is aligned with the first opening.

6. The method of claim 2, further comprising:
    forming a capping layer on the insulating layer before injecting the dopant.

7. The method of claim 1, further comprising:
    planarizing the variable resistance material pattern.

8. The method of claim 1, wherein the forming the first variable resistance material layer includes:
   depositing the first variable resistance material layer using a plasma process.
9. The method of claim 1, wherein
   the dopant includes at least one of germanium, indium, copper, carbon, titanium, cobalt, tungsten, silicon, boron, tin, and gallium.
10. The method of claim 1, wherein
    first region is a crystalline region, and
    the second region is an amorphous region.
11. The method of claim 10, wherein
    the crystalline region extends from a central lower portion of the first opening, and
    the amorphous region is on an upper portion of a sidewall of the first opening.
12. The method of claim 1, wherein the doping the variable resistance material pattern with the dopant includes:
    forming a diffusion source layer on the variable resistance material pattern; and
    heat-treating the substrate to diffuse the dopant from the diffusion source layer to the variable resistance material pattern.
13. A method of manufacturing a variable resistance memory device, comprising:
    forming an insulating layer on a substrate,
    the insulating layer defining an opening that exposes a portion of a bottom electrode on the substrate;
    forming a first variable resistance material layer to fill the opening,
    the variable resistance material layer including a plurality of elements,
    the plurality of elements including at least one element having a heat of vaporization that is greater than an other element among the plurality of elements;
    forming a second variable resistance material layer by removing a seam of the first variable resistance material layer,
    the second variable resistance material layer including a crystalline region disposed in the opening of the insulating layer, and an amorphous region on the crystalline region;
    forming a third variable resistance material layer by doping the second variable resistance material layer with a dopant,
    the dopant including the at least one element having a heat of vaporization that is greater than the other element among the plurality of elements;
    forming a variable resistance material pattern by planarizing the third variable resistance material layer until a top surface of the insulating layer is exposed; and
    forming a top electrode on the variable resistance material pattern.
14. The method of claim 13, further comprising:
    forming a capping layer on the second variable resistance material layer before forming the third variable resistance material layer.
15. The method of claim 13, further comprising:
    forming a first insulating layer on the substrate,
    the first insulating layer defining a contact hole;
    forming a spacer on sidewalls of the contact hole; and
    forming the bottom electrode in the contact hole between the spacer.
16. The method of claim 13, further comprising:
    activating the dopant and the plurality of elements by heat-treating the substrate.
17. A method of manufacturing a memory device, comprising:
    forming a variable resistance material pattern including a first element and a second element on a bottom electrode,
    the first element having a higher heat of vaporization than the second element,
    the variable resistance material pattern including a first region and a second region,
    the first region having a lower concentration of the first element than the second region;
    treating the variable resistance material pattern, the treating increasing a concentration of the first element compared to the second element in a first region of the variable resistance material pattern by doping the first element into the first region of the variable resistance material pattern; and
    forming a top electrode on the treated variable resistance material pattern.
18. The method of claim 17, wherein the variable resistance material pattern includes:
    at least one of tellurium (Te), selenium (Se), and antimony (Sb); and
    at least one of germanium (Ge), bismuth (Bi), lead (Pb), tin (Sn), silver (Ag), arsenic (As), sulfur (S), silicon (Si), phosphorous (P), oxygen (O), indium (In), and nitrogen (N).
19. The method of claim 17, wherein the forming the variable resistance material pattern includes:
    forming a variable material resistance layer;
    removing a seam of the variable material resistance layer, and
    patterning the variable material resistance layer.

* * * * *